United States Patent [19]

Watanabe et al.

[11] Patent Number: 5,439,845

[45] Date of Patent: Aug. 8, 1995

[54] PROCESS FOR FABRICATING LAYERED SUPERLATTICE MATERIALS AND MAKING ELECTRONIC DEVICES INCLUDING SAME

[75] Inventors: Hitoshi Watanabe, Tokyo, Japan; Carlos A. Paz De Araujo, Colorado Springs, Colo.; Hiroyuki Yoshimori, Kanagawa, Japan; Michael C. Scott, Colorado Springs, Colo.; Takashi Mihara, Saitama, Japan; Joseph D. Cuchiaro; Larry D. McMillan, both of Colorado Springs, Colo.

[73] Assignees: Olympus Optical Co., Ltd., Japan; Symetrix Corporation, Colorado Springs, Colo.

[21] Appl. No.: 350,323

[22] Filed: Dec. 5, 1994

Related U.S. Application Data

[60] Division of Ser. No. 65,656, May 21, 1993, which is a continuation-in-part of Ser. No. 981,133, Nov. 24, 1992, and a continuation-in-part of Ser. No. 965,190, Oct. 23, 1992, which is a continuation-in-part of Ser. No. 807,439, Dec. 13, 1991, abandoned, which is a continuation-in-part of Ser. No. 660,428, Feb. 25, 1991, abandoned.

[51] Int. Cl.[6] ............................................. H01L 29/15
[52] U.S. Cl. ...................................... 437/130; 117/92; 427/126.3; 437/133; 437/919
[58] Field of Search .................. 117/84, 92; 357/23.5; 427/126.3, 130, 133, 919

[56] References Cited

U.S. PATENT DOCUMENTS

| | | | |
|---|---|---|---|
| 4,704,785 | 11/1989 | Curran | 437/110 |
| 4,830,983 | 5/1989 | Thornton | 437/161 |
| 5,191,510 | 3/1993 | Huffman | 361/313 |

OTHER PUBLICATIONS

"Process Optimization And Characterization of Device Worthy Sol-Gel Based PET For Ferroelectric Memories," Melnick, et al., Ferroelectrics, 1990. vol. 109. pp. 1-23.

*Primary Examiner*—R. Bruce Breneman
*Assistant Examiner*—Felisa Garrett
*Attorney, Agent, or Firm*—Duft, Graziano & Forest

[57] ABSTRACT

A liquid precursor containing a metal is applied to a substrate, RTP baked, and annealed to form a layered superlattice material. Prebaking the substrate and oxygen in the RTP and anneal is essential, except for high bismuth content precursors. Excess bismuth between 110% and 140% of stoichiometry and RTP temperature of 725° C. is optimum. The film is formed in two layers, the first of which uses a stoichiometric precursor and the second of which uses an excess bismuth precursor. The electronic properties are so regularly dependent on process parameters and material composition, and such a wide variety of materials are possible, that electronic devices can be designed by selecting from a continuous record of the values of one or more electronic properties as a continuous function of the process parameters and material composition, and utilizing the selected process and material composition to make a device.

5 Claims, 21 Drawing Sheets

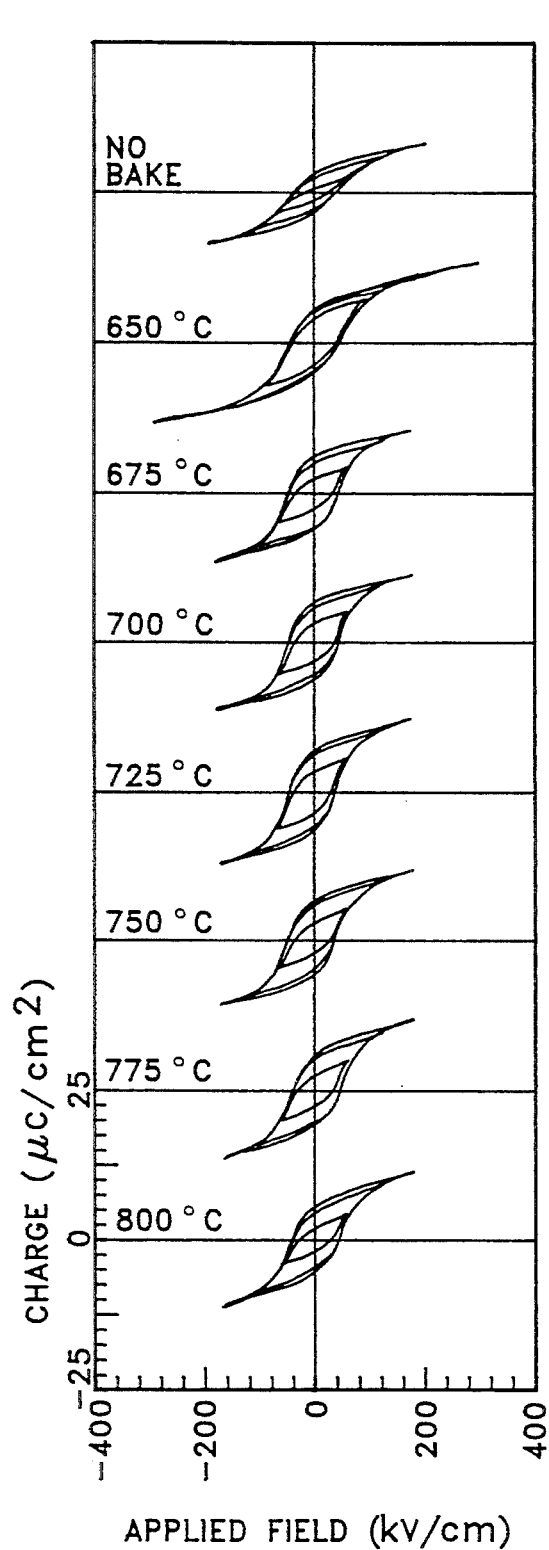
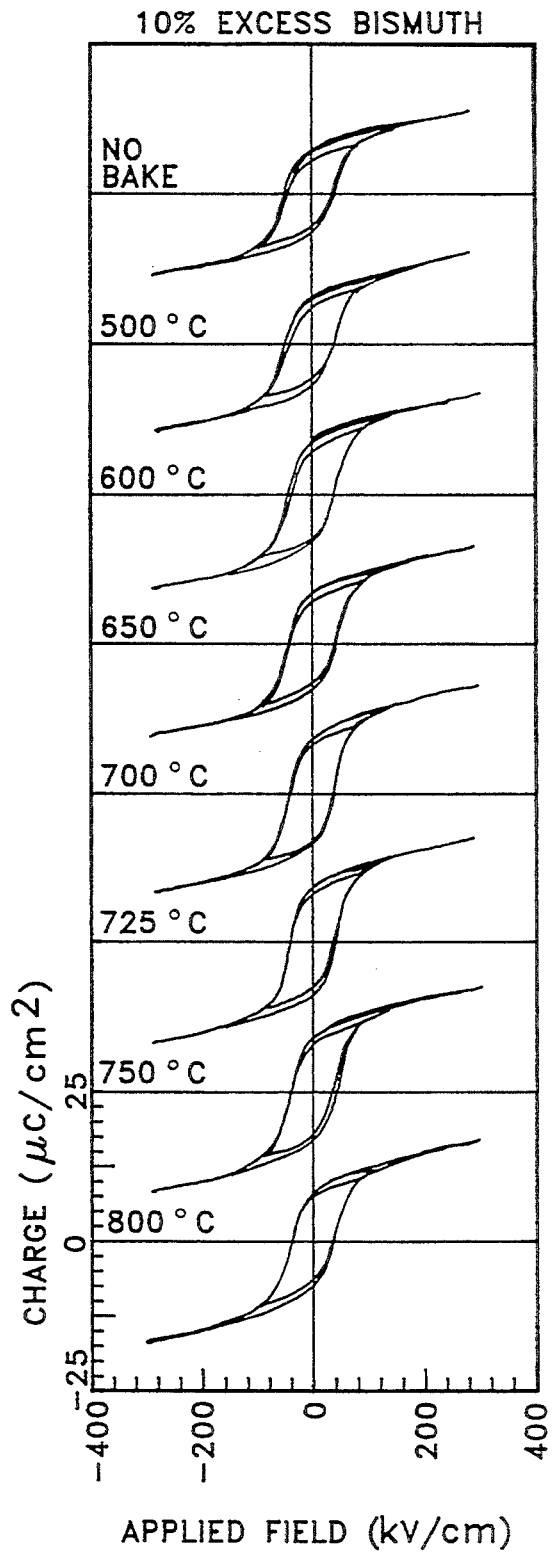
FIG. 7
FIG. 8

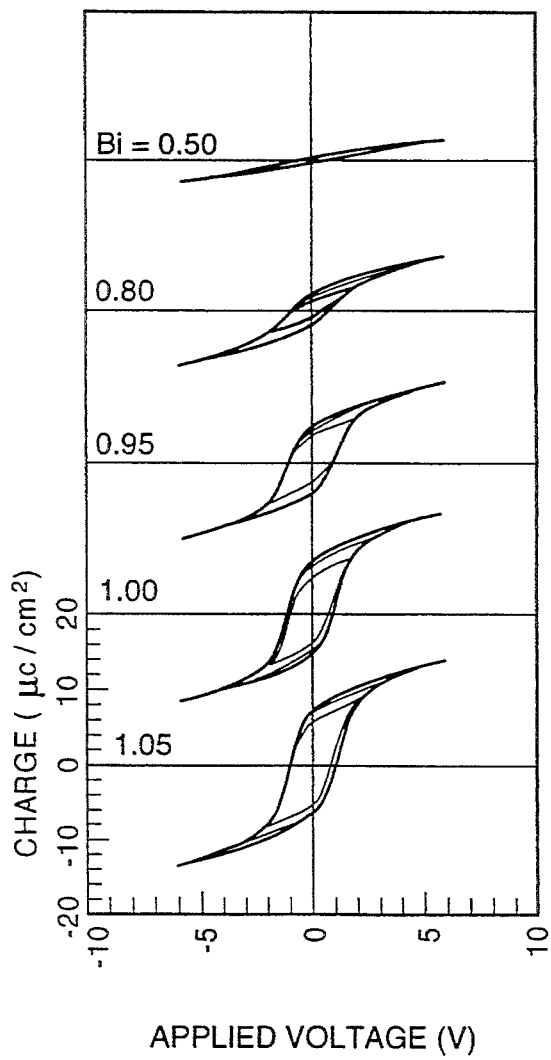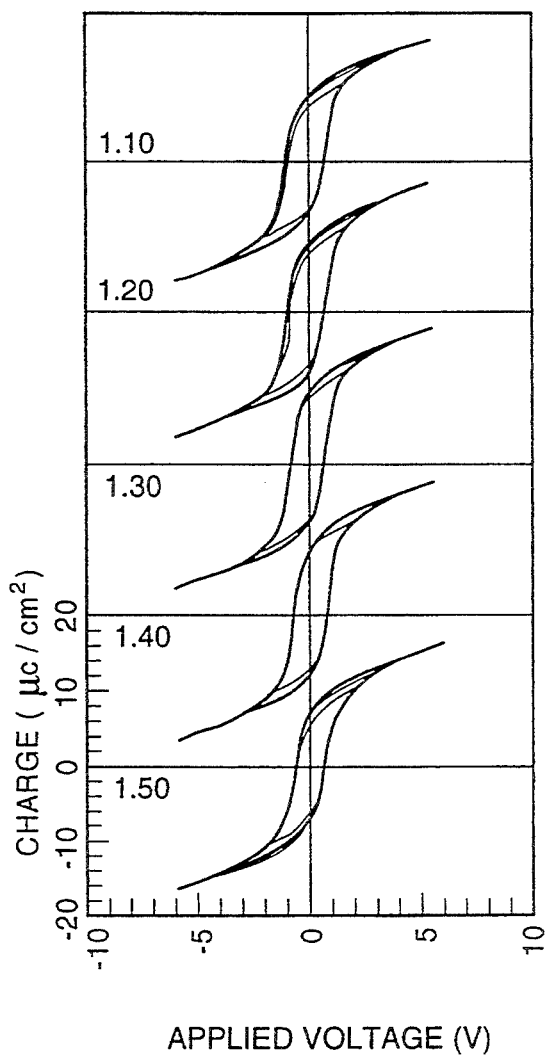
FIG. 10A
FIG. 10B $Nb(\%)$ IN $SrBi_2(Ta_y, Nb_{1-y})_2O_9$ FATIGUE CYCLES ($10^n$)

| | THICKNESS | 2Pr | 2Ec |
|---|---|---|---|
| Ti | 188 nm | 20.5 µC/cm² | 214 kV/cm |
| Ti$_{0.80}$Nb$_{0.20}$ | 265 | 24.5 | 139 |
| Ti$_{0.50}$Nb$_{0.50}$ | 255 | 6.5 | 46 |
| Ti$_{0.33}$Nb$_{0.67}$ | 255 | 1.9 | 38 |
| Ti$_{0.20}$Nb$_{0.80}$ | 250 | 1.6 | 46 |
| Nb | 173 | 18.5 | 300 |
| Ti | 188 nm | 20.5 µC/cm² | 214 kV/cm |
| Ta | 173 | 14.6 | 110 |
| Ti$_{0.81}$Ta$_{0.10}$Nb$_{0.09}$ | 255 | 24.9 | 131 |
| Ti$_{0.52}$Ta$_{0.25}$Nb$_{0.23}$ | 245 | 4.1 | 39 |
| Ti$_{0.35}$Ta$_{0.34}$Nb$_{0.31}$ | 235 | 1.0 | 27 |
| Ti$_{0.14}$Ta$_{0.45}$Nb$_{0.41}$ | 225 | 4.6 | 110 |
| Ti$_{0.10}$Ta$_{0.60}$Nb$_{0.30}$ | 220 | 5.3 | 109 |
| Ti$_{0.10}$Ta$_{0.80}$Nb$_{0.10}$ | 215 | 6.7 | 89 |
| Ti$_{0.20}$Ta$_{0.60}$Nb$_{0.20}$ | 235 | 2.0 | 58 |

FIG. 27    2Pr, 2Ec AT 6 VOLTS, 5 kHz

PROCESS FOR FABRICATING LAYERED SUPERLATTICE MATERIALS AND MAKING ELECTRONIC DEVICES INCLUDING SAME

This application is a divisional of U.S. patent application Ser. No. 08/065,656, now allowed, filed May 21, 1993, which is a continuation-in-part of U.S. patent application Ser. No. 07/981,133 filed Nov. 24, 1992 and Ser. No. 07/965,190 filed Oct. 23, 1992 which in turn are continuations-in-part of U.S. patent application Ser. No. 07/807,439 filed Dec. 13, 1991, now abandoned, which is a continuation-in-part of U.S. patent application Ser. No. 07/660,428 filed Feb. 25, 1991, abandoned.

BACKGROUND OF THE INVENTION

1. Field of the Invent/on

The invention in general relates to the fabrication of layered superlattice materials, and more particularly to fabrication processes that provide low fatigue ferroelectric and reliable high dielectric constant integrated circuit devices that are unusually resistant to degradation.

2. Statement of the Problem

Copending U.S. patent application Ser. No. 07/965,190 filed Oct. 23, 1992 discloses that the layered superlattice materials discovered by G. A. Smolenskii, V. A. Isupov, and A. I. Agranovskaya (See Chapter 15 of the book, *Ferroelectrics and Related Materials*, ISSN 0275-9608, [V.3 of the series Ferroelectrics and Related Phenomena, 1984] edited by G. A. Smolenskii, especially sections 15.3–15) are far better suited for ferroelectric and high dielectric constant integrated circuit applications than any prior materials used for these applications. These layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices, such as a ferroelectric and non-ferroelectric sublattices. Generally, each layered superlattice material will include two or more of the above metals; for example, strontium, bismuth and tantalum form the layered superlattice material strontium bismuth tantalate, $SrBi_2Ta_2O_9$. Copending U.S. patent application Ser. No. 07/981,133, describes a method of fabricating layered superlattice thin films that results in electronic properties for these materials several times better than the best previously known. This disclosure more fully develops certain aspects of the previous application, and discloses improvements in the fabrication process that together approximately double the values of the critical ferroelectric parameters, such as the polarizability, over the values obtained with the basic process described in the copending Ser. No. 981,133 application.

In addition to having good values of the ferroelectric parameters, it is also important that the physical quality of the ferroelectric films be suitable for use in manufacturing processes. For example, the film should have a relatively uniform grain size, which results in better crystalline quality, i.e films free of cracks and other defects. The film grain size should also be small compared to the thickness of the film; otherwise the roughness of the film can be comparable to the thickness and other dimensions of the device components, which makes it difficult or impossible to fabricate devices within tolerances and results in short circuits and other electrical breakdowns. Further, it is important that the fabrication processes be ones that can be performed relatively rapidly, since long processes are more expensive in terms of the use of facilities and personnel.

Rapid thermal processing and furnace annealing in an atmosphere of oxygen are several of many processes that are well-known in the thin-film fabrication technology, See for example, "Process Optimization and Characterization of Device Worthy Sol-Gel Based PZT for Ferroelectric Memories", B. M. Melnick, J. D. Cuchiaro, L. D. McMillan, C. A. Paz De Araujo, and J. F. Scott in *Ferroelectrics*, Vol 109, pp. 123 (1990). It is also known to add excess lead in fabricating PZT using a spin-on and annealing process to account for lead lost as lead oxide vapor in the fabrication process. See U.S. Pat. No. 5,028,455 issued to William D. Miller et al. It is also known to add excess $Bi_2O_3$ when fabricating a bismuth titanate thin film using sputtering to compensate for the loss of this component in the sputtering process. See "A New Ferroelectric Memory Device, Metal-Ferroelectric-Semiconductor Transistor", by Shu-Yau Wu, *IEEE Transactions On Electron Devices*, August 1974, pp. 499–504. E. C. Subbarao, in "A Family of Ferroelectric Bismuth Compounds", *J. Phys. Chem. Solids*, V. 23, pp. 665–676 (1962), discloses the creation of solid solutions of some layered superlattice materials and that several of their physical parameters, i.e., the dielectric constant and Curie temperature change as the proportions of the various elements comprising the solid solution change. However, these are only some of the hundreds of processes and parameters that potentially can affect the quality of a layered superlattice material, and prior to the work of the present inventors, how to use these and other fabrication parameters to arrive at ferroelectric properties such as extremely low fatigue rates and polarizabilities as high as 25 in layered superlattice materials was unknown, despite the fact that those skilled in the art had been searching for materials with such properties for more than thirty years.

It is a common practice to use recorded data regarding processes and. materials in designing electronic devices. Generally, in designing electronic devices, one goes to literature to discover processes that result in the desired products, uses tables and similar recorded material to select materials with the desire properties, and likewise may use tables and similar sources to select the specific process parameters. However the data is scattered and disconnected. For example, the properties used in selecting materials and the processes used in fabricating a silicon-based electronic device are usually found in a different source and are not related in a systematic way to a the materials and processes used in fabricating a gallium arsenide-based electronic device. Despite the long history of integrated circuit manufacturing and the wealth of data available, as often as not the specifics of the materials and processes are selected through trial and error.

3. Solution to the problem:

The present invention solves the above problem by providing a method of fabricating a layered superlattice material comprising the steps of: providing a substrate, and a precursor containing a metal; applying the precursor to the substrate; and rapid thermal processing (RTP bake) the precursor on the substrate to form a layered superlattice material containing the metal on the substrate. The RTP bake is performed between 500° C. and 850° C. The RTP bake is followed by furnace annealing at a temperature of between 700° C. and 850° C. Both the RTP bake and furnace anneal are best performed in an oxygen-enriched atmosphere.

When the layered superlattice material comprises a thin ferroelectric film which forms the material between the two electrodes of a capacitor, the best results are obtained if a first furnace anneal is performed after the layered superlattice material is formed and a second furnace anneal is performed after the second electrode is deposited. The second anneal may take place before or after the capacitor is patterned, or alternatively, a second anneal may be performed prior to patterning and a third anneal performed after patterning. The second and third anneal processes are performed at a temperature lower than the first anneal temperature.

If the material is one having the formula $SrBi_{4-2x-+\alpha}\{(Ta_y,Nb_{1-y})_x,(Ti_z,Zr_{1-z})_{2-2x}\}_2O_{15-6x}$, where $0 \leq x \leq 1.0$, $0 \leq y \leq 1.0$, $0 \leq z \leq 1.0$, and $x-2 \leq \alpha \leq 1.6(2-x)$, preferably, $0.7 \leq x \leq 1.0$, $0.8 \leq y \leq 1.0$, $0.6 \leq z \leq 1.0$, and $0 \leq \alpha \leq 0.8(2-x)$, RTP baking is necessary to obtain ferroelectrics with high polarizability. RTP baking is not always necessary when using a precursor of high bismuth content, i.e a material having the following composition: $SrBi_{4-2x-+\alpha}\{(Ta_y,Nb_{1-y})_x,(Ti_z,Zr_{1-z})_{2-2x}\}_2O_{15-6x}$, where $0 \leq x \leq 1.0$, $0 \leq y \leq 1.0$, $0 \leq z \leq 1.0$, and $0 \leq \alpha \leq 1.6(2-x)$, preferably, $0.7 \leq x \leq 1.0$, $0.8 \leq y \leq 1.0$, $0.6 \leq z \leq 1.0$, and $0 \leq \alpha \leq 1.2(2-x)$.

Prebaking the substrate to a temperature above the temperature of the rapid thermal anneal step prior to the step of applying the precursor to the substrate is also a key factor in obtaining high performance ferroelectrics.

The invention also provides a method of fabricating a layered superlattice material comprising the steps of: providing a precursor comprising a metal dissolved in a solvent, the solvent having a first value of solvent parameter; adding a predetermined quantity of a second solvent to the precursor, the solvent having a second value of the solvent parameter different than the first value; the predetermined quantity being such that the precursor has a desired value of the solvent parameter different than the first value and the second value; applying the precursor to a substrate; and treating the precursor to form a layered superlattice material on the substrate. Preferably the solvent parameter comprises a parameter selected from the group comprising solubility, viscosity, and boiling point. Particularly if one of the metals in the layered superlattice material is strontium, the quality of the film is greatly enhanced if n-butyl acetate is one of the solvents.

If one of the metals is bismuth, the polarizability of the ferroelectric is greatly enhanced if about 125% of the normal stoichiometric amount of bismuth is added.

The invention also provides a process comprising the steps of: providing a substrate; forming a first thin film, the step of forming a first thin film including the step of applying a first precursor solution for a layered superlattice material to the substrate, the precursor solution having a first relative amount of a first element of the layered superlattice material as compared to a second element of the layered superlattice material; forming a second thin film, the step of forming a second thin film including the step of applying a second precursor solution for the layered superlattice material, the second precursor solution having a second relative amount of the first element of the layered superlattice material as compared to the second element to form a second thin film; and heating the first and second thin films to form the layered superlattice thin film. Preferably, the first precursor solution comprises a stoichiometric solution and the second precursor solution comprises a solution having an excess amount of the first element. Preferably, the first element comprises an element selected from the group comprising bismuth, lead, thallium and antimony. Preferably, the thickness of the second film is less than 50% of the total thickness of the layered superlattice thin film. Thus, for example in the case of the first element being bismuth, there is a bismuth gradient in the uncured film, with more bismuth being present in the layer most distal from the substrate, which layer is exposed during the heating process which creates the crystalline phase of the film. The step of heating preferably comprises annealing in a furnace, and also preferably includes a rapid thermal processing step. The first and second thin films are preferably formed using several coats of the precursor and after each coat the thin films are rapid thermally processed. The process results in a layered superlattice material having an average grain size of from 20 to 200 nm. As compared to the prior art, the process reduces the grain size of the material while reducing the distribution of grain sizes, thus improving the crystallinity of the film. At the same time the process shortens the fabrication time, since the material reaches high values of 2Pr with shorter furnace anneal time.

However, it may not be desirable to use the amount of bismuth that results in the optimum polarizability; it has been found that the electronic parameters vary so regularly with the proportion of bismuth and other elements, such as tantalum, niobium, and titanium, used, and there is such an incredible variety of layered superlattice materials available, that one can design electrical devices by choosing a proportion of elements used in the layered superlattice material that result in the desired electronic properties for the device. Thus the invention also provides a method of making an electrical or electronic device, the method comprising: providing a record of the values of one or more electronic properties of a layered superlattice material as a substantially continuous function of the relative amount of at least one element; selecting a layered superlattice material from the record having a composition corresponding to a desired value of at least one electronic property; and fabricating an electrical or electronic device including the selected layered superlattice material having the composition corresponding to the desired value.

The above method of designing an electrical or electronic device is particularly applicable to devices including layered superlattice materials that include solid solutions of several layered superlattice compounds. In this aspect the invention solves the problem of fabricating high performance ferroelectric and high dielectric constant devices by providing a method of making an electrical or electronic device, the method comprising: providing a record of the values of one or more electronic properties of a layered superlattice solid solution as a substantially continuous function of the proportion of the components of the solid solution; selecting a solid solution from the record with a composition having a desired value of at least one electronic property; and fabricating an electrical or electronic device including a layered superlattice material having the selected composition. The electronic properties may comprise one or more properties selected from the group comprising polarizability, coercive field, leakage current, dielectric constant, and fatigue. The elements that form the solid solution may include elements selected from the group comprising tantalum, niobium, titanium, zirconium and many other elements.

The invention also provides a method of making an electrical or electronic device, the method comprising: providing a record of the values of one or more electronic properties of a layered superlattice material as a substantially continuous function of the value of a fabrication process parameter; selecting a value of a process parameter from the record corresponding to a desired value of at least one electronic property; and making an electrical or electronic device including the layered superlattice material fabricated in a process having substantially the value corresponding to the desired value of at least one electronic property. As indicated above, the one or more process parameters may comprise one or more parameters from the group comprising RTP bake temperature, RTP bake time, furnace anneal temperature, furnace anneal time, and furnace anneal atmosphere.

The methods described above result in layered superlattice materials with excellent electronic properties. For example, ferroelectric layered superlattice materials with polarizabilities, 2Pr, higher than 25 microcoulombs per square centimeter have been fabricated. Numerous other features, objects and advantages of the invention will become apparent from the following description when read in conjunction with the accompanying drawings.

BRIEF DESCRIPTION OF THE DRAWINGS

FIG. 7 shows the hysteresis curves for a sample of strontium bismuth tantalate utilizing a stoichiometric precursor solution and a sequence of different RTP baking temperatures;

FIG. 8 shows the hysteresis curves for a sample of strontium bismuth tantalate utilizing a 10% excess bismuth precursor solution and a sequence of different RTP baking temperatures;

FIGS. 10A and 10B show the hysteresis curves at 2, 4, and 6 volts for samples of strontium bismuth tantalate fabricated utilizing precursor solutions having different bismuth content;

FIG. 27 is a table listing 2Pr and 2Ec for various solid solutions of strontium bismuth titanate, strontium bismuth tantalate, and strontium bismuth niobate;

DESCRIPTION OF THE PREFERRED EMBODIMENT

1. Overview.

Figure 2:
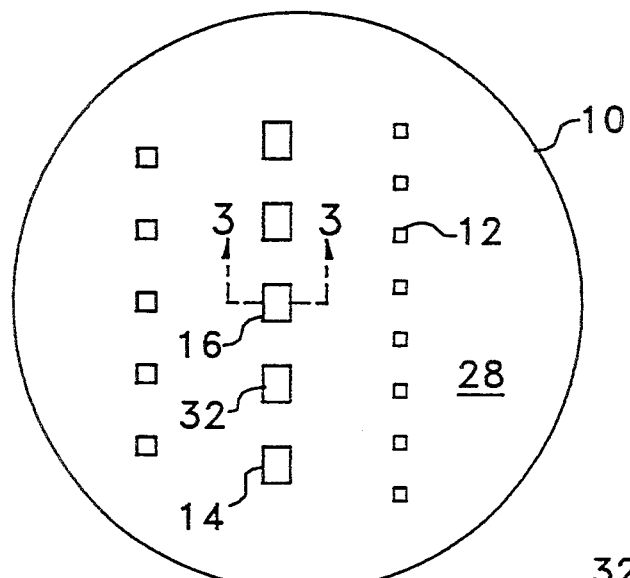
FIG. 2 is a top view of a wafer on which thin film capacitors fabricated by the process according to the invention are shown greatly enlarged.
Figure 3:
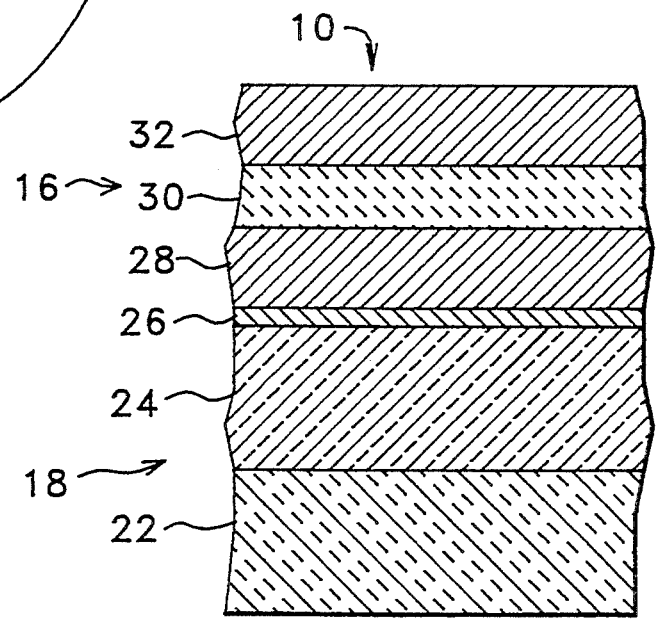
FIG. 3 is a portion of a cross-section of FIG. 2 taken through the lines 3—3, illustrating a thin film capacitor device fabricated by the process according to the invention.

Directing attention to FIGS. 2 and 3, a wafer 10 containing numerous capacitors 12, 14, 16 etc. is shown. FIG. 2 is a top view of the wafer 10 on which the thin film capacitors 12, 14, 16 etc. fabricated by the process according to the invention are shown greatly enlarged. FIG. 3 is a portion of a cross-section of FIG. 2 taken through the lines 3—3 bisecting capacitor 16. Referring to FIG. 3, the wafer 10 includes a silicon substrate 22, a silicon dioxide insulating layer 24, a thin layer of titanium 26 which assists the next layer, which is a platinum electrode 28, in adhering to the silicon dioxide 24, a layer of layered superlattice material 30, and another platinum electrode 32. After the layers 24, 26, 28, 30, and 32, are deposited, the wafer is etched down to layer 28 to form the individual capacitors 12, 14, 16, etc. which are interconnected by the bottom electrode 28. The invention primarily involves the method of creating the layer 30 of layered superlattice material. As mentioned above, these layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices. Generally each layered superlattice material will include two or more of the above metals; for example, barium, bismuth and niobium form the layered superlattice material barium bismuth niobate, $BaBi_2Nb_2O_9$. The material 30 may be a dielectric, a ferroelectric, or both. If it is a dielectric, the capacitor 16 is a dielectric capacitor, and if the material 30 is a ferroelectric, then capacitor 16 is a ferroelectric capacitor. The layered superlattice materials may be summarized more generally under the formula:

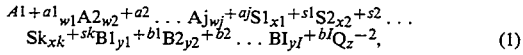

(1)

where A1, A2 . . . Aj represent A-site elements in the perovskite-like structure, which may be elements such as strontium, calcium, barium, bismuth, lead, and others S1, S2 . . . Sk represent super-lattice generator elements, which usually is bismuth, but can also be materials such as yttrium, scandium, lanthanum, antimony, chromium, thallium, and other elements with a valence of +3, B1, B2 . . . BI represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2 \ldots +ajwj)+(s1x1+s2x2 \ldots +skxk)+(b1y1+b2y2 \ldots +bjyj)=2z. \quad (2)$$

Formula (1) includes all three of the Smolenskii type compounds. The layered superlattice materials do not include every material that can be fit into the formula (1), but only those which spontaneously form themselves into crystalline structures with distinct alternating layers. It should be noted that the x, y, and z symbols in the formula (1) should not be confused With the x, y, and z, symbols used in the formulas (I) and (I') below. The formula (1) is a general formula for layered superlattice materials, while the formulae (I) and (I') are formulae for solid solutions of particular layered superlattice materials.

It should also be understood that the term layered superlattice material herein also includes doped layered superlattice materials. That is, any of the material included in formula (1) may be doped with a variety of materials, such as silicon, germanium, uranium, zirconium, tin or hafnium. For example, strontium bismuth tantalate may be doped with a variety of elements as given by the formula:

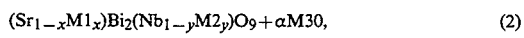

(2)

where M1 may be Ca, Ba, Mg, or Pb, M2 may be Ta, Bi, or Sb, with x and y being a number between 0 and 1 and preferably $0 \leq x \leq 0.2$, $0 \leq y \leq 0.2$, M3 may be Si, Ge, U, Zr, Sn, or Hf, and preferably $0 \leq \alpha \leq 0.05$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-x) SrBi_2Ta_2O_9 + xABO_3, \qquad (3)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

$$(1-x) SrBi_2Ta_2O_9 + xABO_3, + \alpha MeO, \qquad (3)$$

where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

Figure 4:
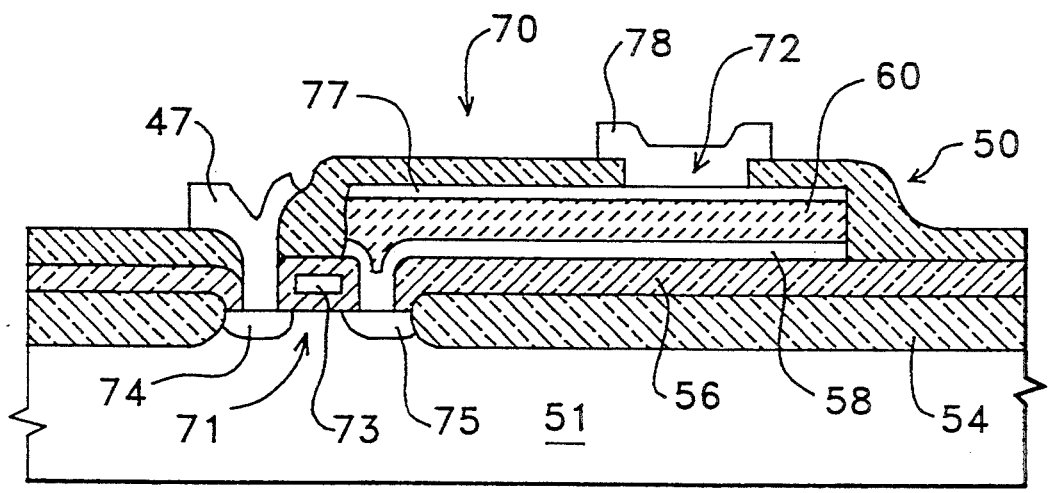
FIG. 4 is a cross-sectional illustration of a portion of an integrated circuit fabricated utilizing the process of the invention.

FIG. 4 shows an example of the integration of a layered superlattice capacitor 72 into a DRAM memory cell to form an integrated circuit 70 such as may be fabricated using the invention. The memory cell 50 includes a silicon substrate 51, field oxide areas 54, and two electrically interconnected electrical devices, a transistor 71 and a ferroelectric switching capacitor 72. Transistor 71 includes a gate 73, a source 74, and a drain 75. Capacitor 72 includes first electrode 58, ferroelectric layered superlattice material 60, and second electrode 77. Insulators, such as 56, separate the devices 71, 72, except where drain 75 of transistor 71 is connected to first electrode 58 of capacitor 72. Electrical contacts, such as 47 and 78 make electrical connection to the devices 71, 72 to other pads of the integrated circuit 70. A detailed example of the complete fabrication process for an integrated circuit memory cell as shown in FIG. 4 is given in U.S. patent application Ser. No. 919,186, which is incorporated herein by reference. It should be understood that FIGS. 2, 3, 4 depicting the capacitors 12, 14, 16 etc. and integrated circuit 70 are not meant to be actual cross-sectional views of any particular portion of an actual electronic device, but are merely idealized representations which are employed to more clearly and fully depict the structure and process of the invention than would otherwise be possible.

This disclosure describes the fabrication and testing of numerous capacitors 12, 14, 16 having layers 22, 24, 26, 28, 30, and 32 made of the materials above, disclosing a wide spectrum of variations of the fabrication process according to the invention and a variety of different layered superlattice materials 30. It then discloses how this data is used to design and manufacture electronic devices utilizing layered superlattice materials. It should be understood, however, that the specific processes and electronic devices described are exemplary; that is the invention contemplates that the layers in FIGS. 3 and 4 may be made of many other materials than those mentioned above and described below, there are many other variations of the process of the invention than can be included in a document such at this, and the method and materials may be used in many other electronic devices other than the capacitors, such as 12, 14, 16 etc. and the integrated circuit 70. It should also be noted that the word "substrate" is used in both a specific and a general sense in this disclosure. In the specific sense it refers to the specific silicon layer 22, conventionally called a silicon substrate, on which the exemplary electronic devices described are fabricated. In a general sense, it refers to any material, object, or layer on which another layer or layers are formed. In this sense, for example, the layers 22, 24, 26, and 28 comprise a substrate 18 for the layer 30 of layered superlattice material 30.

A term that is used frequently in this disclosure is "stoichiometry" or "stoichiometric". As used herein, the term stoichiometric generally expresses a relationship between the precursor solution and the final layered superlattice film 30. A "stoichiometric precursor" is one in which the relative proportions of the various metals in the precursor is the same as the proportion in a homogeneous specimen of the intended final layered superlattice thin film 30. This proportion is the one specified by the formula for the final thin film 30.

2. Detailed Description of the Fabrication Process

Figure 1:
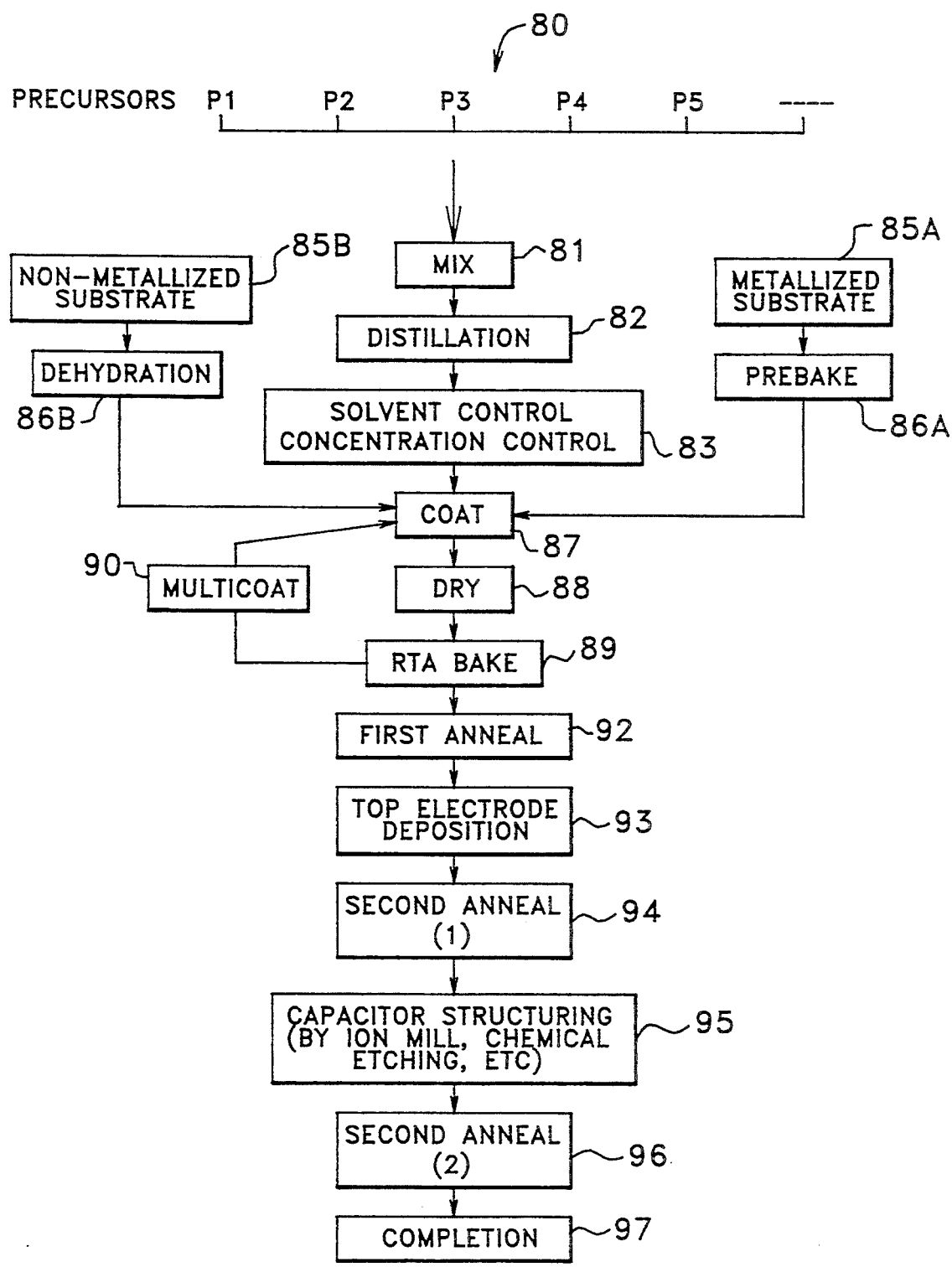
FIG. 1 is a flow chart showing the preferred embodiment of a process for preparing a thin film of a layered superlattice material according to the invention.

Turning now to a more detailed description of the invention, a flow chart of the preferred embodiment of a process according to the invention for preparing a thin film of a layered superlattice material, such as 30 and 60, and a device, such as 10 and 70 incorporating the material 30 and 60, is shown in FIG. 1. We shall first review each step of the preferred process briefly, and then discuss the individual steps in more detail and provide examples of the process. The first step 80 of the process is the preparation of the precursor or precursors, P1, P2, P3, etc. In the preferred embodiment the precursors are liquids in which a compound or compounds of the metals to comprise the layered superlattice material 30 are dissolved. The precursors are then mixed in step 81, and the mixed precursors are distilled in step 82. Then follows a solvent control and/or concentration control step 83. Generally this step is taken over two stages which may be separated considerably in time. In the first stage the mixed precursor is dissolved in a suitable solvent and concentrated so as to provide a long shelve life. Just before use, the solvent and concentration may be adjusted to optimize the electronic device that results from the process.

In parallel with the solvent and concentration control step 83, the substrate 18 is prepared. If the substrate is a metallized substrate, such as the substrate 18, then the substrate is provided in step 85A by forming the layers 22, 24, 26, and 28 and is then prebaked in step 86A. If the substrate is a non-metallized substrate, such as a silicon or gallium arsenide single crystal, the substrate is provided in step 85B and dehydrated in step 86B. In step 87 the substrate is coated with the precursor. In the examples discussed below, the coating was done by a spin-on process, though a process such as a misted deposition process as described in U.S. patent application Ser. No. 993,380, which is hereby incorporated by reference, or dipping or other suitable coating process may be used. The coated substrate is then dried in step 88, and the baked in an RTP (rapid thermal processor) unit. If the desired thickness of the layer 30 is not obtained, then the series of coat, dry, and RTP bake steps 87, 88, and 89 are repeated as many times as required to build up the desired thickness. The wafer 10 is then annealed in step 92, the top or second electrode 32 is deposited in step 93 by sputtering or other suitable process, and the wafer 10 is then annealed again in step 94. The capacitor 16 is then structured by ion milling, chemical etching, or other suitable process in step 95. Then follows a third anneal in step 96. This completes the process if a capacitor device as in FIG. 2 is the desired end result, however in the case of an integrated circuit as in FIG. 4, there follows completion steps 97 such as contact metalization, capping, etc. As will be discussed further below, not all of the steps outlined above are necessary for every device: some steps are optional and others are used only for certain layered superlattice materials.

The preferred precursors solutions and their preparation in step 80 are discussed in detail in U.S. patent application Ser. No. 981,133 which is hereby incorporated by reference. Generally a metal or a metal compound is reacted with a carboxylic acid, such as 2-ethyl-hexanoic acid, to produce a metal hexanoate, which is dissolved in a suitable solvent or solvents, such as xylenes. Other metal-organic acid esters in addition to the 2-ethylhexanotates that may for suitable precursors when compounded with a metal are the acetates and acetylacetonates. For some metals, such as titanium, the precursor metal compound may comprise a metal alkoxide, such as titanium 2-methoxyethoxide. Other alkoxides that may be compounded with a metal and used as precursor compounds include the methoxides, ethoxides, n-propoxide, iso-propoxides, n-butoxides, iso-butoxides, tert-butoxides, 2-methoxyethoxides, and 2-ethoexyethoxides. The precursor metal compound is preferably dissolved in a solvent having a boiling point greater than the boiling point of water, i.e. 100 ° C. A xylenes solvent works for most metals. For highly electropositive elements, the solvent preferably includes 2-methoxyethanol or n-butyl acetate. Some solvents that may be used, together with their boiling points, include: alcohols, such as 1-butanol (117° C.), 1-pentanol (117° C.), 2-pentanol (119 ° C.), 1-hexanol (157° C.), 2-hexanol (136° C.), 3-hexanol (135° C.), 2-ethyl-1-butanol (146 ° C.), 2-methoxyethanol (124° C.), 2-ethoxyethanol (135° C.), and 2-methyl-1-pentanol (148 ° C.); ketches, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

The precursors of the individual metals may be made separately and then mixed, but generally they are all made together in the same container and mixed as they are made. After mixing, the precursor solution may be distilled to remove water and other undesirable impurities and by-products of the preparation process, although if the precursors and solvents are available in pure enough states, the distillation step 81 may be skipped. The solvent type and concentration may then be adjusted in step 83 either to prepare it for coating, if the coating is to be done immediately, or to provide a precursor with a long shelf life. If the solvent control steps are such as to prepare a solution with a long shelf life, then just before coating, another adjustment will usually be done to optimize the thin film. Some adjustments to produce a long shelf life and to produce high quality films are discussed in detail in U.S. patent application Ser. No. 981,133. It is a feature of the present invention that it has been found that while a single solvent precursor, such as the precursors with xylenes as the solvent described in the prior application, may have a long shelf life, adding a second solvent, or a plurality of solvents immediately prior to coating results in much higher quality thin films.

It has been found that a single solvent often cannot be found that has the optimum solubility, viscosity, and boiling point. The solubility of the metal compound in the solvent determines whether or not fine precipitates occur; the viscosity determines the smoothness of the coating process, and the boiling point determines how fast the solvent vaporizes in the drying process, which effects whether defects appear during the drying. To optimize all the desirable properties, in the preferred embodiment one or more additional solvents are added, and the concentration adjusted, usually by distilling, just prior to coating. Utilizing the boiling point information given above, a solvent with a higher boiling point may be added to retard the overall drying process, or a solvent with a lower boiling point may be added to speed up the drying process. N-butyl acetate may be added to increase the solubility. For example, when n-butyl acetate is added as a third solvent, to a precursor that contains both xylenes and 2-methoxyethanol, preferably in a ratio of approximately 50% xylenes, 20% methoxylethanol, and 30% n-butyl acetate, the resulting thin films have a more even surface and have fewer cracks, spats, and less precipitation of microparticles. Since methoxyethanol is not a good solvent for metal esters such as 2-ethylhexanotes, a recommended solvent for these materials is 50% xylenes and 50% n-butyl acetate. The improvement is especially significant when strontium is one of the metals in the precursor. Generally, solvents with a boiling point above 200° C. are not suitable, even if they have good solubility, because the high evaporation temperature and low vapor pressure are not compatible with the spin-on and drying processes used in the preferred embodiment of the invention. The addition of ethylene glycohol and formamide as evaporation speed control additives has also been found to be effective to control the cracking problem.

In steps 85A and 86A, or steps 85B and 86B, a substrate is provided and prepared for coating. Almost any substrate that will support a thin film and is compatible with the materials and processes described herein may be used. Some of these substrates include oxidized or non-oxidized silicon or gallium arsenide semiconducting wafers, with or without integrated circuits and/or metalized layers added, plates of silicon or glass, and other electronic device chips. For the exemplary devices of this disclosure, the substrates were metalized substrates 18 as shown in FIG. 3. The fabrication of the substrate 18 is described in detail in prior application Ser. No. 981,133 referred to above, and will not be repeated herein. While platinum with a titanium adhesion layer is the metalization used in the examples discussed, numerous other metals may be used such as platinum with an adhesion layer of tantalum, tungsten, molybdenum, chromium, nickel or alloys of these metals, and titanium nitride. Sputtering or vacuum deposition are the preferred deposition processes, though other metalization processes may be used. Heating of the substrates during the metalization deposition is effective to increase adhesion. It has been found that prebaking of the metalized substrate at a temperature that is higher than or equal to the temperature of any of the subsequent processes performed on the wafer 10, which processes are described below, is usually necessary to optimize the electronic properties of the thin film 30. The prebaking step 86A comprises baking in an oxygen atmosphere, preferably with an oxygen content of between 500° C. and 1000° C. prior to the coating step 87. Preferably the wafer 10 is baked in a diffusion furnace. The substrate prebake step 86A removes water and organic impurities from the substrate surface. More importantly, the prebaking decreases the internal stress of the metal layer 28 through the annealing effect of the prebaking and the partial oxidation and interdiffusion of the adhesion layer 26 metal. All this increases the adhesion between the substrate 18 and the layered superlattice film 30 and minimizes the peeling problem. Further, if the adhesion layer 26 is a transition metal, the partial oxidation stabilizes the metal chemically. Therefore the number of mobile atoms penetrating into the layered superlattice layer 30 through the platinum layer 28 is drastically decreased, and the layered superlattice layer 30 crystallizes smoothly without defects due to the diffused ions. If the substrate is not metallized, then the silicon or other wafer is dehydrated at a lower temperature.

The precursor mixing, distillation, solvent control, and concentration control steps 81, 82, and 83 have been discussed separately and linearly for clarity. However, these steps can be combined and/or ordered differently depending on the particular liquids used, whether one intends to store the precursor or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 18. Preferably the coating is done by a spin-on process. The preferred precursor solution concentration is 0.01 to 0.50M (moles/liter), and the preferred spin speed is between 500 rpm and 5000 rpm.

The spin-on process and the misted deposition process remove some of the solvent, but some solvent remains after the coating. This solvent is removed from the wet film in a drying step 88. At the same time, the heating causes thermal decomposition of the organic elements in the thin film, which also vaporize and are removed from the thin film. This results in a solid thin film of the layered superlattice material 30 in a precrystallized amorphous state. This dried film is sufficiently rigid to support the next spin-on coat. The drying temperature must be above the boiling point of the solvent, and preferably above the thermal decomposition temperature of the organics in precursor solution. The preferred drying temperature is between 150° C. and 400° C. and depends on the specific precursor used. The drying step may comprise a single drying step at a single temperature, or multiple step drying process at several different temperatures, such as a ramping up and down of temperature. The multiple step drying process is useful to prevent cracking and bubbling of the thin film which can occur due to excessive volume shrinkage by too rapid temperature rise. An electric hot plate is preferably used to perform the drying step 88.

The drying step 88 is optionally followed by an RTP bake step 89. Radiation from a halogen lamp, and infrared lamp, or an ultraviolet lamp provides the source of heat for the RTP bake step. In the examples, an AG Associates model 410 Heat Pulser utilizing a halogen source was used. Preferably, the RTP bake is performed in an oxygen atmosphere of between 20% and 100% oxygen, at a temperature between 500° C. and 850° C., with a ramping rate between 1° C./sec and 200° C./sec, and with a holding time of 5 seconds to 300 seconds. Any residual organics are burned out and vaporized during the RTP process. At the same time, the rapid temperature rise of the RTP bake promotes nucleation, i.e. the generation of numerous small crystalline grains of the layered superlattice material in the solid film 30. These grains act as nuclei upon which further crystallization can occur. The presence of oxygen in the bake process is essential in forming these grains.

The thickness of a single coat, via the spin process or otherwise, is very important to prevent cracking due to volume shrinkage during the following heating steps 88, 89, and 92. To obtain a crack-free film, a single spin-coat layer must be less than 2000 Å after the bake step 89. Therefore, multiple coating is necessary to achieve film thicknesses greater than 2000 Å. The preferred film fabrication process includes RTP baking for each spin-on coat. That is, as shown in FIG. 1, the substrate 18 is coated, dried, and RTP baked, and then the process 90 is repeated as often as necessary to achieve the desired thickness. However, the RTP bake step is not essential for every coat. One RTP bake step for every two coats is practical, and even just one RTP bake step at the end of a series of coats is strongly effective in improving the electronic properties of most layered superlattice ferroelectrics. For a limited number of specific precursor/layered superlattice material compositions, particularly ones utilizing concentrations of bismuth in excess of stoichiometry, the RTP bake step 89 is not necessary.

Once the desired film thickness has been obtained, the dried and preferably baked film is annealed in step 92, which is referred to as a first anneal to distinguish it from subsequent anneals. The first anneal is preferably performed in an oxygen atmosphere in a furnace. The oxygen concentration is preferably 20% to 100%, and the temperature is above the crystallization temperature of the particular layered superlattice material 30. Generally, for the materials of the invention, this temperature is above 700° C. To prevent evaporation of elements from the layered superlattice material 30 and to prevent thermal damage to the substrate, including damage to integrated circuits already in place, the annealing temperature is preferably kept below 850° C. Preferably the annealing for strontium bismuth tantalate is done at about 800° C. for 30 to 90 minutes, and is in a similar range for most other layered superlattice materials. Again, the presence of oxygen is important in this first anneal step. The numerous nuclei, small grains generated by the RTP bake step, grow, and a well-crystallized ferroelectric film is formed under the oxygen-rich atmosphere.

After the first anneal, the second or top electrode 32 is formed. Preferably the electrode is formed by RF sputtering of a platinum single layer, but it also may be formed by DC sputtering, ion beam sputtering, vacuum deposition or other appropriate deposition process. If desirable for the electronic device design, before the metal deposition, the layered superlattice material 30 may be patterned using conventional photolithography and etching, and the top electrode 32 is then patterned in a second process after deposition. In the examples described herein, the top electrode 32 and layered superlattice material 30 are patterned together using conventional photolithography techniques and ion beam milling.

As deposited, the adhesion of the top electrode 32 to the layered superlattice material is usually weak. Preferably, the adhesion is improved by a heat treatment. The wafer 10 including the layered superlattice film 30 covered by the top electrode 32 may be annealed before the patterning step 95 described above in a heat treatment designated in FIG. 1 as the second anneal (1) step 94, after the patterning step 95 by a heat treatment designated in FIG. 1 as the second anneal (2) step 96, or both before and after the patterning step 95. The second anneal is preferably performed in an electric furnace at a temperature between 500° C. and the first anneal temperature. A second anneal below 500° C. does not improve the adhesion of electrode 32, and the resulting capacitor devices are sometimes extremely leaky, and shorted in the worst cases.

The second anneal releases the internal stress in the top electrode 32 and in the interface between the electrode 32 and the layered superlattice material 30. At the same time, the second annealing step 94, 96 reconstructs microstructure in the layered superlattice material 30 resulting from the sputtering of the top electrode, and as a result improves the properties of the material. The effect is the same whether the second anneal is performed before or after the patterning step 95. The effect of oxygen ambient during the second anneal is not as clear as it is in the case of RTP bake 89 and the first anneal 92, because the layered superlattice material 30 is covered by the top electrode and not exposed to the ambient atmosphere. With regard to most electrical properties, inert gas, such as helium, argon, and nitrogen may be used with approximately the same result as with oxygen. However, it has been found that an oxygen atmosphere during the second anneal improves the crystallographic order at the interface of the electrode 32 and layered superlattice material 30 as well as the symmetry of the hysteresis curve.

3. Examples of the Fabrication Process and Properly Dependence

Figure 5:
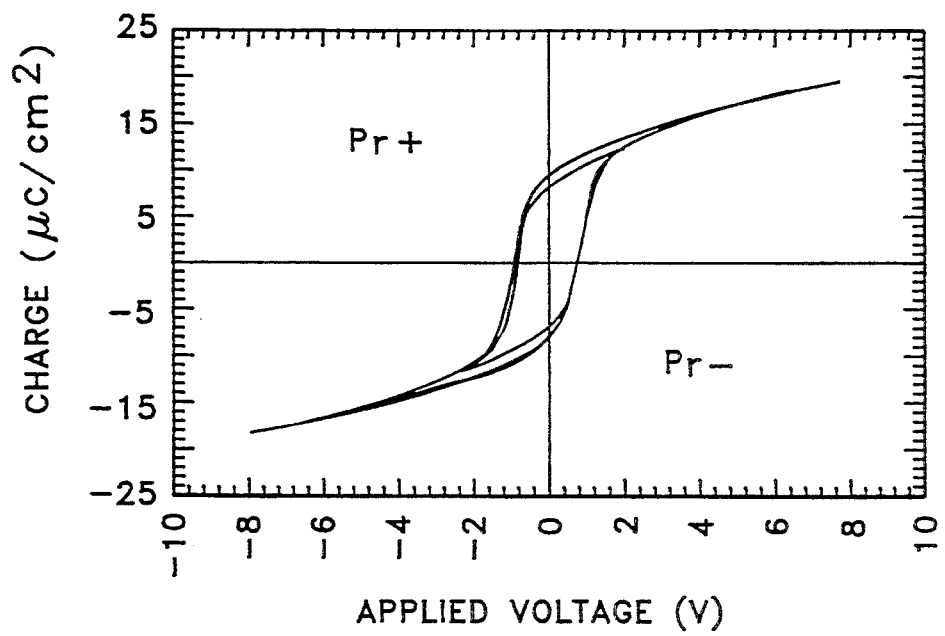
FIG. 5 shows hysteresis curves at $\pm 2$, $\pm 4$, $\pm 6$ and $\pm 8$ volts for a sample of $SrBi_2Ta_2O_9$ having 10% excess bismuth and fabricated according to the invention.
Figure 11:
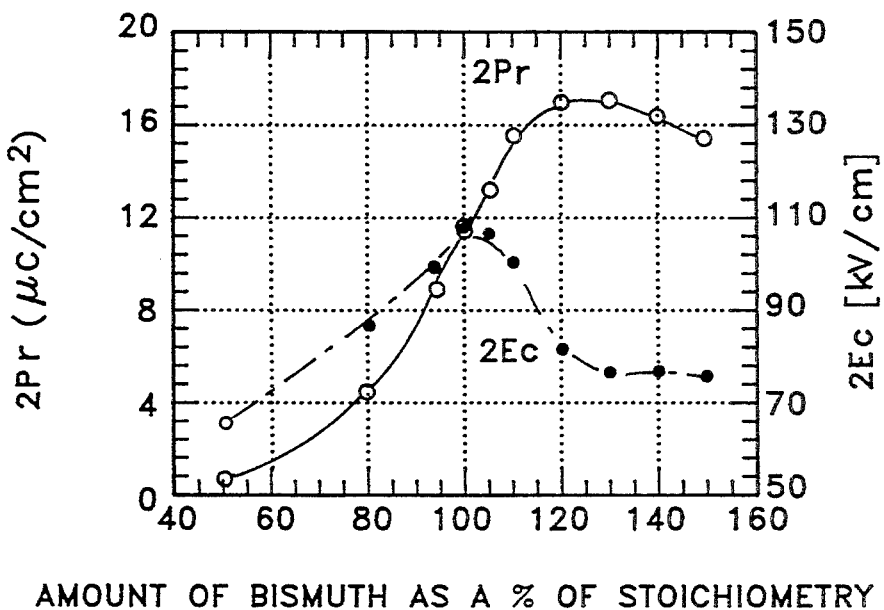
FIG. 11 shows graphs of 2Pr and 2Ec for the 6 volt hysteresis curves of FIG. 10.

Below, examples of the fabrication process according to the invention as applied to a wafer 10 as shown in FIGS. 2 and 3 are given. Following each of the examples, there is a discussion of the electrical/electronic properties illustrated in the figures. The figures include hysteresis curves, such as FIG. 5, and material endurance or "fatigue" curves such as FIG. 6. The hysteresis curves are given in terms of either the applied voltage in volts, as for example in FIG. 5, or the electric field in kilovolts per centimeter, as for example in FIG. 7, versus the polarization charge in microcoulombs per centimeter squared. Generally, the hysteresis is shown for three different voltages (or fields) generally, 2 volts, 4 volts, and 6 volts. As is well-known, hysteresis curves which suggest good ferroelectric properties tend to be relatively boxy and long in the direction of polarization, rather than thin and linear. The hysteresis measurements were all made on an uncompensated Sawyer-Tower circuit unless otherwise noted. The endurance or "fatigue" curves give the polarization charge, 2Pr, in microcoulombs per square centimeter versus the number of cycles. The polarization charge 2Pr is the charge created by switching a capacitor such as 16 from a state where it is fully polarized in one direction, say the upward vertical direction in FIG. 3, to the opposite fully polarized state, which would be the downward vertical direction in FIG. 3. Here, by "fully polarized" means the state in which the ferroelectric material has been polarized fully and the field removed. In terms of an hysteresis curve, such as shown in FIG. 5, it is the difference between $Pr_+$, the point where the hysteresis curve crosses the positive polarization axis (y-axis), and $Pr_-$, the point where the hysteresis curve crosses the negative polarization axis. Unless otherwise noted, the value of 2Pr given is taken from the hysteresis measurement at the highest voltage. The higher the value of 2Pr, the better will be the performance of the material in ferroelectric memories and other applications. A cycle is defined as the capacitor, such as 16, being switched through one square pulse. This polarization, 2Pr, is approximately twice the remnant polarization, Pr. Other figures, such as FIG. 11, also show the value 2Ec, which is given in kilovolts per cm, versus some other parameter, such as the amount of bismuth in the stoichiometry (FIG. 11). The parameter 2Ec is equal to the sum of the coercive field on the positive side, Ec+, and the coercive field on the negative side, Ec−, upon a voltage change, generally taken as from −6 to +6 volts for the figures shown. The coercive field is a measure of the size of the field that is required to switch the material from one polarization state to another. For a practical electronic device, it should be high enough that stray fields will not cause polarization switching, but if it is too high, large voltages will be required to operate the device. Other parameters and terms used in the figures and discussion should be clear from the context.

EXAMPLE 1

A wafer 10 including a number of capacitors 12, 24, 16, etc. was fabricated in which the layered superlattice material 30 was strontium bismuth tantalate ($SrBi_2Ta_2O_9$). The precursor solution comprised strontium 2-ethylhexanoate, bismuth 2-ethylhexanoate, and tantalum 2-ethylhexanoate in a xylenes solvent. The plural "xylenes" is used instead of the singular "xylene", because commercially available xylene includes three different fractionations of xylene. The three metal 2-ethylhexanoates were mixed in a proportion such that the strontium and tantalum were present in the mixed precursor in stoichiometric proportions, while the bismuth was present in 110% of stoichiometry. The molarity of the solution was approximately 0.2 moles per liter. The precursor was diluted to 0.13 moles per liter by the addition of n-butyl acetate. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 1500 RPM for 40 seconds. The wafer 10 was then placed on a hot plate and baked in air at about 170° C. for 5 minutes and then at 250° C. for another 5 minutes. The wafer 10 was then RTP baked at 25° C. with a ramping rate of 125° C./sec, a hold time of 30 seconds, a natural cool time of 6 minutes, and an ambient oxygen flow of approximately 100–200 cc/minute. The steps from using an eyedropper to deposit solution on the wafer through RTP baking were repeated for another coat. The wafer was then transferred to a diffusion furnace and annealed at 800° C. in an oxygen flow of 6 l/m for 60 minutes. The top layer 32 of 2000 Å platinum was sputtered, a resist was applied, followed by a standard photo mask process, an ion mill etch, an IPC strip and a second anneal at 800°

C. in an oxygen flow of about 6 l/m for 30 minutes. The final thickness of the layered superlattice film 30 was 2000 Å.

Figure 6:
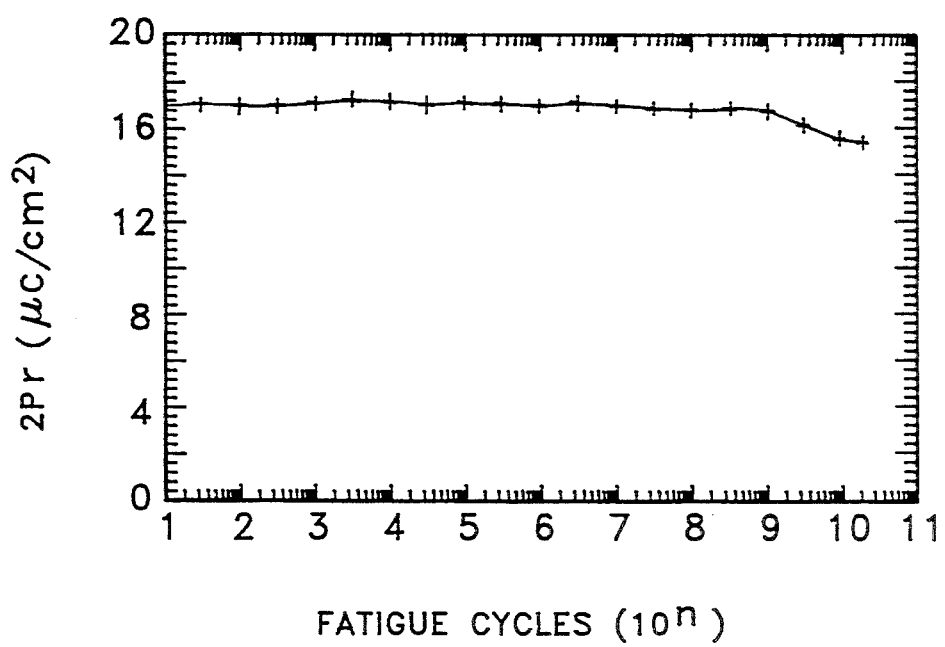
FIG. 6 is a graph of 2Pr versus number of cycles for the sample of FIG. 5 illustrating the excellent resistance to fatigue of the material according to the invention.

FIG. 5 shows initial hysteresis curves for the SrBi$_2$Ta$_2$O$_9$ sample fabricated in Example 1 measured at FIG. 6 is a graph of 2 Pr versus number of cycles for the sample of FIG. 5 taken from a series of 20 hysteresis curves such as those of FIG. 5; this may be referred to as an endurance or "fatigue" curve as it demonstrates the decline in 2 Pr, which may be interpreted as the amount of fatigue of the material, over the number of cycles switched. FIG. 6, shows that the fatigue over 2×10$^{10}$ cycles is less than 10%. Moreover the value of 2 Pr is about 17 C/cm$^2$.

The basic process for making low-fatigue layered superlattice materials and devices utilizing such materials, as discussed and claimed in the copending U.S. patent application Ser. No. 981,133, results in similar excellent low-fatigue results as shown in FIGS. 4 and 5. In both the materials made according to the basic process of the prior disclosure and the materials made with the added improvements of the present disclosure, the coercive field is such that electronic devices that operate in the range of 2 to 10 volts, the standard range for integrated circuits, are possible. With the improved process of the present disclosure, polarizabilities in the range of 15 C/cm$^2$ to more than 25 C/cm$^2$ are possible, while keeping the same excellent resistance to fatigue and excellent coercive field size.

Figure 9:
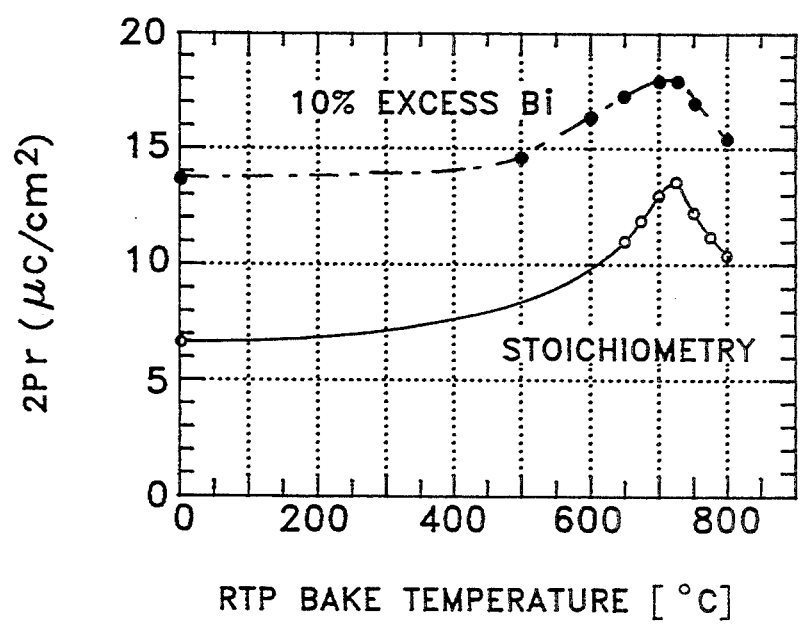
FIG. 9 shows graphs of 2Pr versus RTP bake temperature for the respective sets of hysteresis curves of FIGS. 7 and 8.

To investigate the effect of RTP baking temperature, samples were fabricated as described in example 1 except that various hold temperatures were utilized. In one series of samples the precursors were mixed so that the proportions of strontium, bismuth and tantalum were stoichiometric, while in another series 10% extra bismuth was added. In the stoichiometric samples, the thickness of the layered superlattice layers 30 was between 2100 Å and 2200 Å. In the 10% excess bismuth samples the thickness was about 2000 Å. The hysteresis curves were measured a 2, 4, and 6 volts for both series of samples with the results shown in FIG. 7 for the stoichiometric samples and in FIG. 8 for the 10% excess bismuth samples. FIG. 9 shows a graph of 2 Pr measured from the 6 volt hysteresis curves of FIGS. 7 and 8. For both the stoichiometric samples and the 10% excess bismuth samples, the value of 2 Pr increases dramatically above 500° C., and has a maximum at about 725° C.±25° C. The optimum RTP baking temperature has been found to vary with the particular layered superlattice material.

Figure 34:
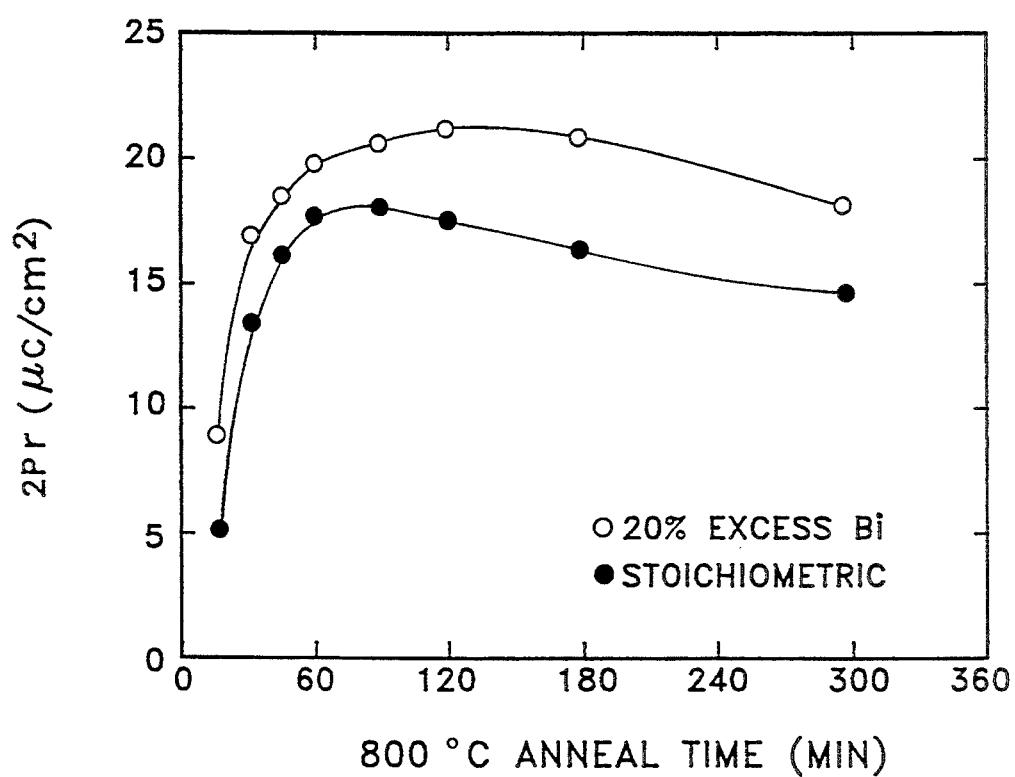
FIG. 34 compares a graph of 2Pr versus anneal time in minutes for samples of strontium bismuth tantalate fabricated from precursors having 20% excess bismuth with a similar graph for samples fabricated from a stoichiometric precursor.

It is also noted from FIG. 8 that for the 10% excess bismuth the hysteresis curve at 2 volts is almost superimposed on the hysteresis curves for 4 volts and 6 volts. This is an extremely useful property since it indicates that the a range of applied voltages will result in nearly the same electronic response, which allows one to design electronic devices that will perform consistently over a range of voltages. Further, from FIG. 9, the value of 2 Pr is consistently and significantly higher for the 10% excess bismuth samples than for the stoichiometric samples. FIG. 34 shows a graph of 2 Pr versus anneal time for samples of strontium bismuth tantalate using a stoichiometric precursor as compared to samples using a 20% excess bismuth precursor. The 20% excess bismuth content material reaches a higher ultimate 2 Pr value than either the stoichiometric sample or the 10% excess bismuth sample of FIG. 9, although the maximum is reached after a longer annealing time. However, for any given annealing time, the 2 Pr of the 20% excess bismuth sample stays well above that for the stoichiometric sample. This superior performance in the samples with excess bismuth in the precursor solution is believed to be due to the fact that bismuth and bismuth oxide have a higher vapor pressure (lower vapor point) than the other metals in the layered superlattice material and the oxides of these other metals. Since the thin film preparation process includes several heating steps, some at relatively high temperatures, the bismuth and bismuth oxide are easily vaporized during the fabrication process. As a result, some bismuth is lost during the process, and if a stoichiometric proportion of bismuth was present in the mixed precursor, there will be less than a stoichiometric amount in the completed thin film, and the resulting layered superlattice material will have many defects, especially on the surface, with resulting degradation of the crystalline state and the ferroelectric properties that depend on that state. The excess bismuth compensates for the loss of bismuth during fabrication, resulting in a more nearly stoichiometric thin film and improved ferroelectric properties. The effect of excess bismuth content on the properties of strontium bismuth tantalate was studied more thoroughly in a second variation of the process of the invention utilizing a bismuth gradient, which will be discussed below. As will be seen, this variation overcomes the problem of the long annealing time required to reach the maximum 2 Pr for the excess bismuth samples.

From the data of FIGS. 7, 8, and 9, another fact becomes apparent. RTP bake improves 2 Pr for the materials formed from stoichiometric precursors by more than 100%. RTP bake also improves the performance of the excess bismuth materials, but only by about 30%. Thus RTP bake is essential for the materials formed from stoichiometric precursors, but not essential for materials formed from precursors with excess bismuth. Put in terms of the layered superlattice compound formula, the RTP baking step is necessary when using a precursor solution with the following composition:

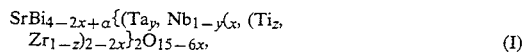  (I)

where $0 \leq x \leq 1.0$, $\leq y \leq 1.0$, $0 \leq z \leq 1.0$, and $x-2 \leq a \leq 1.6(2-xx)$. The parameter $a$ represents the amount of bismuth in the material. The range of $a$ just given is equivalent to a range of bismuth from 50% to 180% of stoichiometry. Preferably, $0.7 \leq x \leq 1.0$, $0.8 \leq y \leq 1.0$, $0.6 \leq z \leq 1.0$, and $0 \leq a \leq 0.8(2-x)$, which is of stoichiometry. RTP baking is not always necessary when using a precursor of the following composition:

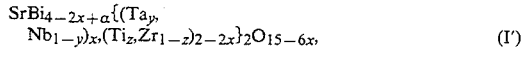  (I')

where $0 \leq x \leq 1.0$, $0 \leq y \leq 1.0$, $0 \leq z \leq 1.0$, and $0 \leq a \leq 1.6(2-x)$, which range is equivalent to bismuth content of 100% to 180% of stoichiometry; preferably, $0.7 \leq x \leq 1.0$, $0.8 \leq y - 1.0$, $0.6 \leq z \leq 1.0$, and $0 \leq a \leq 1.2(2-x)$, which range is equivalent to a bismuth content of 100% to 160% of stoichiometry.

Finally, another fact that arises from the data above is that by controlling the bismuth content of the precursor, one can control the electronic properties, such as 2

Pr, 2 Ec, and the resistance to fatigue. As we shall see in more detail below, this leads to the ability to design electronic devices utilizing recorded data such as that discussed above.

EXAMPLE 2

A series of ten wafers 10 including a number of capacitors 12, 24, 16, etc. was fabricated in which the layered superlattice material 30 was strontium bismuth tantalate ($SrBi_2Ta_2O_9$). The precursor solution comprised strontium 2-ethylhexanoate, bismuth 2-ethylhexanoate, and tantalum 2-ethylhexanoate in a xylenes solvent. The three metal 2-ethylhexanoates were mixed in a proportion such that the strontium and tantalum were present in the mixed precursor in stoichiometric proportions, while the bismuth was present in the following proportions different percentage of stoichiometry for each of the ten wafers: 50%; 80%; 95%; 100%; 105%; 110%; 120%; 130%; 140%; and 150% of stoichiometry. The molarity of the solution was approximately 0.09 moles per liter. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 2000 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C/sec, a hold time of 30 seconds, a natural cool time of 6 minutes, and an ambient oxygen flow of about 100–200 cc/minute. The steps from using an eyedropper to deposit solution on the wafer through RTP baking were repeated for another coat. The wafer was then transferred to a diffusion furnace and annealed at 800° C. in an oxygen flow of 6 l/min for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/min for 30 minutes. The final thickness of the layered superlattice film 30 was 1900 Å to 2100 Å.

Figure 12:
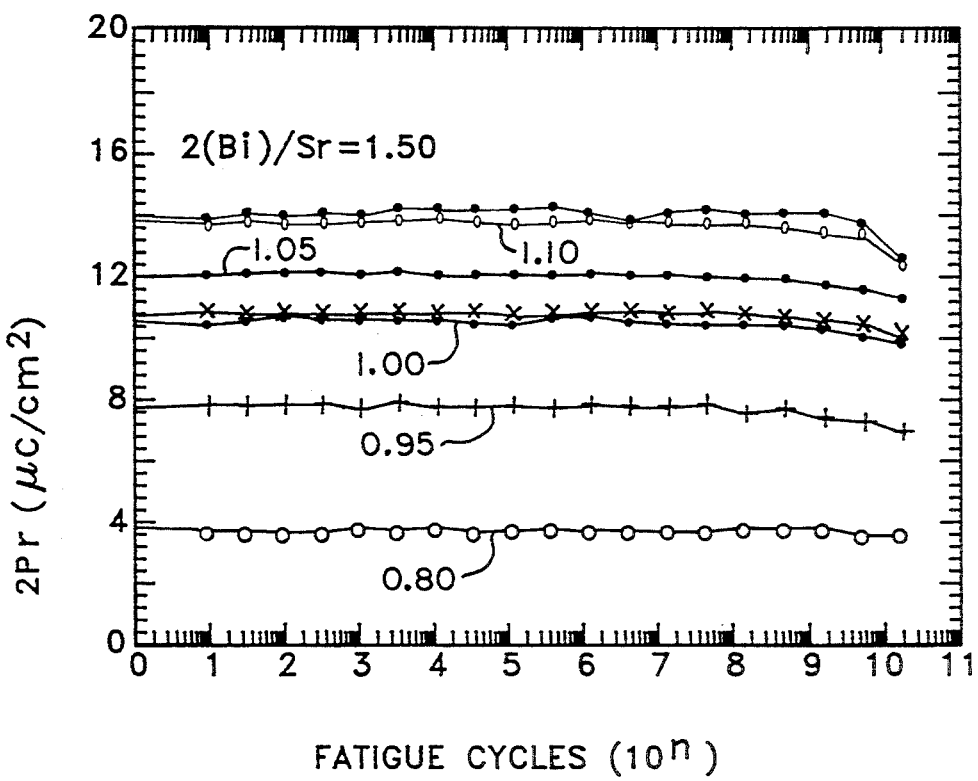
FIG. 12 shows graphs of 2Pr versus number of cycles for the samples of FIG. 10.

Hysteresis curves for each of the ten samples made according to the process of Example 2 are shown in FIGS. 10A amd 10B. As indicated above, all were prepared with an RTP bake at about 725° C. The values of 2 Pr and 2 Ec taken from the 6 volt hysteresis curves are plotted in FIG. 11. The graph shows that the material is clearly ferroelectric above 50% of stoichiometry. As the amount of bismuth increases, so does 2 Pr and 2 Ec. At about 100% of stoichiometry, 2 Ec peaks and then decreases steadily until it becomes relatively flat at about 130% of stoichiometry. 2 Pr peaks at about 120% of stoichiometry [α=0.4 in the formula (I) or (I′)] and then decrease. s gradually. The upper limit of bismuth concentration is defined by the electrical shorting of the thin film due to the degradation of film quality caused by excessive grain growth or migration of excess bismuth. FIG. 12 is a graph showing the fatigue of the samples of Example 2 having the different bismuth concentrations. All of the samples show excellent resistance to fatigue, which property does not depend on the bismuth content as long as the material is ferroelectric.

The excellent properties for the films having excess bismuth are also applicable to other elements which form high vapor pressure compounds during the process of fabricating layered superlattice materials. In addition to bismuth, other such elements are lead, thallium and antimony.

EXAMPLE 3

A series of three wafers 10 including a number of capacitors 12, 24, 16, etc. was fabricated in which the layered superlattice material 30 was strontium bismuth tantalate ($SrBi_2Ta_2O_9$). The precursor solution comprised strontium 2-ethylhexanoate, bismuth 2-ethylhexanoate, and tantalum 2-ethylhexanoate in a xylenes solvent. The three metal 2-ethylhexanoates were mixed in a proportion such that the strontium, bismuth and tantalum were present in the mixed precursor in stoichiometric proportions. There was no dilution with a second solvent. The molarity of the solution was approximately 0.11 moles per liter. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 1500 RPM for 40 seconds. The wafer 10 was then placed on a hot plate and baked in air at about 180° C. for 3 minutes and then at 250° C. for 5 minutes. The wafer 10 was then RTP baked at 700° C. with a ramping rate of 125° C./sec, a hold time of 30 seconds, a natural cool time of 6 minutes, and an ambient oxygen flow of 100–200 cc/minute. The steps from using an eyedropper to deposit solution on the wafer through RTP baking were repeated for another two coats for a total of three coats. The wafer was then transferred to a diffusion furnace and annealed. For one sample the annealing temperature was 700° C. for 120 minutes; for a second sample the annealing temperature was 750° C. for 120 minutes; for the third sample the annealing temperature was 800° C. for 30minutes. All annealing was in an oxygen flow of 6 l/m for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/m for 30 minutes. The final thickness of the layered superlattice film 30 in each case was about 3000 Å.

Figure 13:
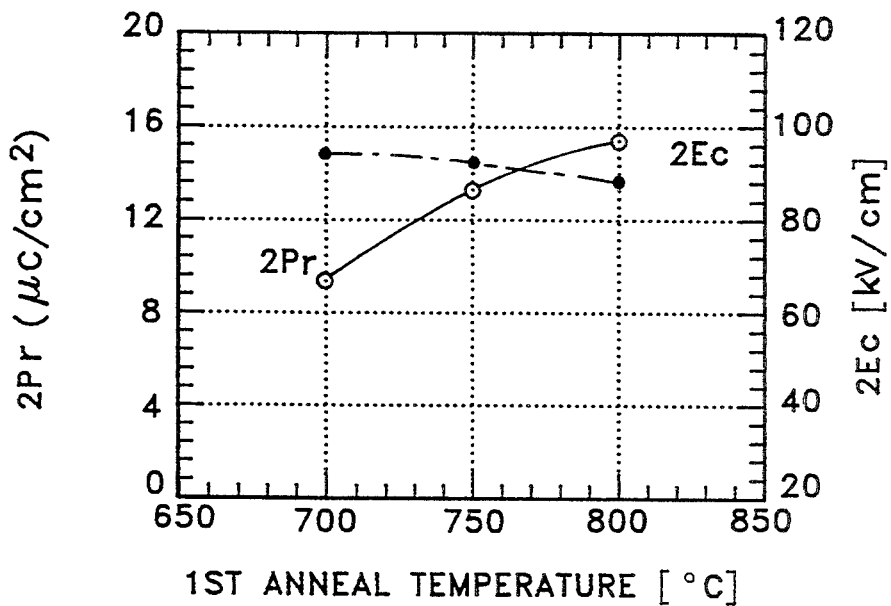
FIG. 13 shows graphs of 2Pr and 2Ec versus first anneal temperature for samples of strontium bismuth tantalate.

FIG. 13 shows a graph of 2 Pr and 2 Ec for the samples of Example 3 versus the first anneal temperature. The sample annealed at 800° C. shows improved ferroelectric performance even though it was annealed for a much shorter time. Thus annealing temperature is critical. Below 650° C., the crystallization does not proceed even if the film had been previously RTP baked at a high temperature.

Figure 14:
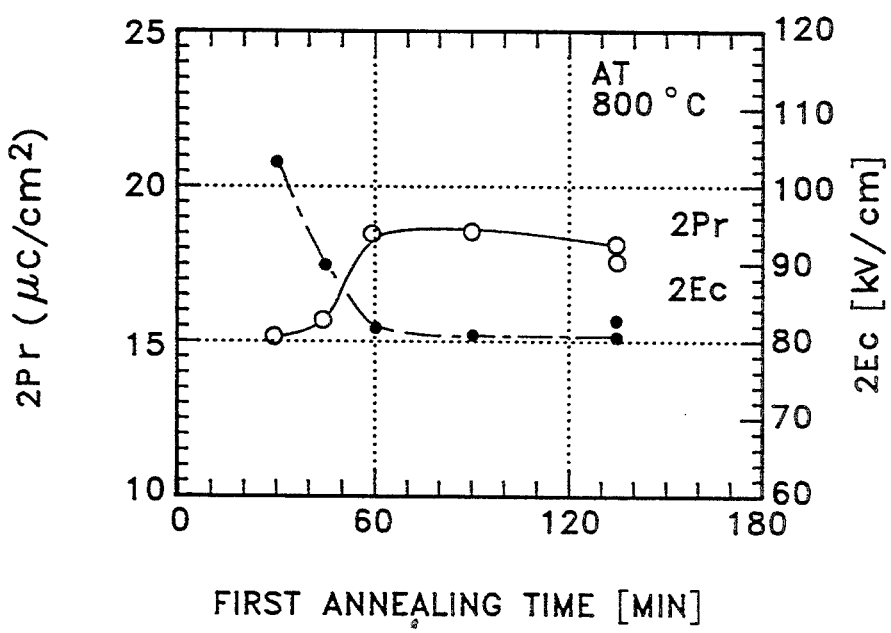
FIG. 14 shows graphs of 2Pr and 2Ec versus first anneal time for samples of strontium bismuth tantalate prepared with a first anneal temperature of 800° C.

Another series of five samples of $SrBi_2Ta_2O_9$ were fabricated as in Example 3, except that the first anneal was performed at 800° C. for all of the samples and the annealing time was as follows: 30 minutes, 45 minutes; 60 minutes; 90 minutes; and 140 minutes. The final thickness of the samples was about 2200 Å. 2 Pr and 2 Ec measured from the 6-volt hysteresis curves for each sample are plotted in FIG. 14. 2Pr is essentially saturated at 60 minutes, and decreases after about 120 minutes. 2 Ec decreases only slightly after 60 minutes. The results suggest that an anneal time in excess of about 90 minutes is not beneficial, and may even degrade performance by promoting bismuth evaporation and substrate damage. At 800° C., the anneal time should be between 30 minutes and 90 minutes.

Figure 15:
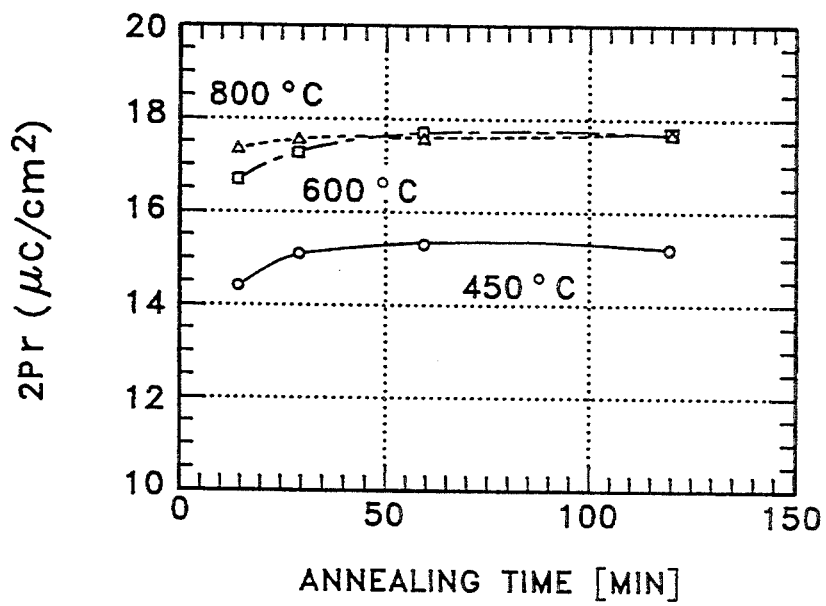
FIG. 15 shows graphs of 2Pr versus second anneal time for samples of strontium bismuth tantalate prepared with 10% excess bismuth and different second anneal temperatures.

A series of twelve samples were fabricated as described in Example I except that the drying temperature on the hot plate was 180° C. and the second anneal was performed or each combination of the following temperatures and times: 450° C., 600° C., and 800° C; for 15 minutes, 30 minutes, 60 minutes, and 120 minutes. The measured value of 2 Pr is plotted in FIG. 15 for each series of times at a given temperature. The 600° C. anneal shows an essentially equal improvement over the 450° C. anneal for every anneal time. The 600° C. anneal shows results equal to the 800° C. anneal for times longer than about 45 minutes.

Figure 16:
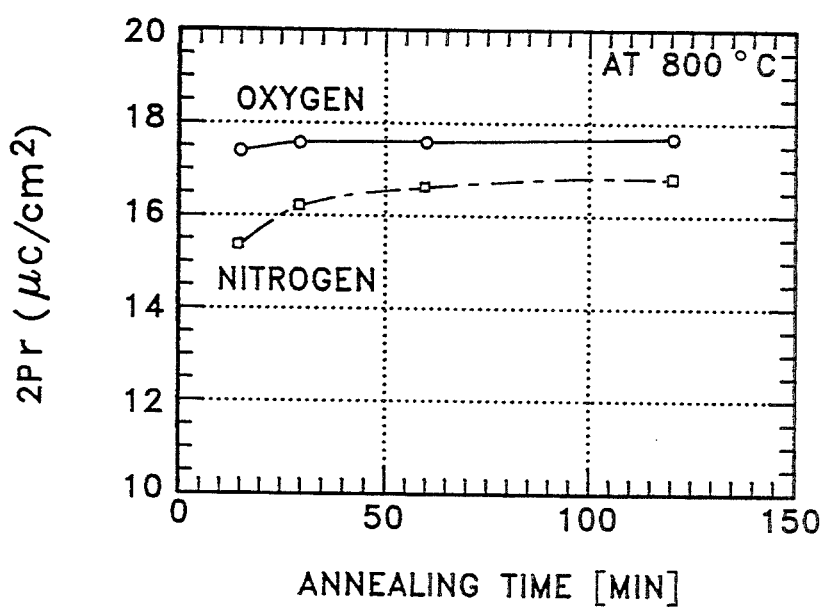
FIG. 16 shows graphs of 2Pr versus second anneal time for samples of strontium bismuth tantalate prepared with 10% excess bismuth and under atmospheres of oxygen and nitrogen.

Another series of eight samples was fabricated as described in the above paragraph, except that the second anneal was performed at 800° C. for all samples and one series of four samples was annealed under oxygen ambient conditions and the other under nitrogen ambient conditions. The results are graphed in FIG. 16. The samples fabricated under an oxygen atmosphere show clearly better 2 Pt results than the samples annealed under the nitrogen atmosphere, though not as pronounced as for the temperature differences. This is believed to be due to the oxygen having effect mainly at the surface of the material.

4. Dependence of Electronic Properties on the Elements Comprising the Layered Superlattice Material In this section various solid solutions of strontium bismuth tantalate, strontium bismuth niobate, strontium bismuth titanate, and strontium bismuth zirconate shall be discussed. To shorten the technical description and make the figures easier to read, strontium bismuth tantalate will sometimes be referred to as tantalate or abbreviated as Ta, strontium bismuth niobate will sometimes be referred to as niobate or abbreviated as Nb, strontium bismuth titanate will sometimes be referred to as titanate or abbreviated as Ti, and strontium bismuth zirconate will sometimes be referred to as zirconate or abbreviated as Zr. This designation should always be clear from the context. This method of designating the layered superlattice materials helps illuminate the utility of the methods of the invention for designing electronic devices.

In the following example, layered superlattice materials comprising a solid solution of strontium bismuth tantalate (Ta) and strontium bismuth niobate (Nb) were investigated.

EXAMPLE 4—Strontium Bismuth Tantalum Niobate (TaNb)

A series of wafers 10 including a number of capacitors 12, 24, 16, etc. was fabricated in which the layered superlattice material 30 was strontium bismuth tantalum niobate [$SrBi_2(Ta_y, Nb_{1-y})_2O_9$], that is, a solid solution of Ta and Nb, was fabricated. The precursor solution comprised strontium 2-ethylhexanoate, bismuth 2-ethylhexanoate, tantalum 2-ethylhexanoate and niobium 2-ethylhexanoate in a xylenes solvent. The four metal 2-ethylhexanoates were mixed in a proportion such that the strontium, bismuth, tantalum, and niobium were present in the mixed precursor in stoichiometric proportions, with y taking on a series of values from 0 to 1. The molarity of the solution was approximately 0.10 moles per liter. No dilution with a second solvent was performed. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of about 6 liters/min. An eyedropper was used to place 1 ml of the [$SrBi_2(Ta_y, Nb_{1-y})_2O_9$] precursor solution on the substrate 18. The wafer was spun at 1500 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of 100 to 200 cc/minute. The steps from using an eyedropper to deposit solution on the wafer through RTP baking were repeated for another coat. The wafer was then transferred to a diffusion furnace and annealed at 800° C. in an oxygen flow of 6 l/m for 60 minutes. The top layer 32 of 200 Å platinum was sputtered, a resist was applied, followed by a standard photo mask process, an ion mill etch, an IPC strip and a second anneal at 800° C. in an oxygen flow of 6 l/m for 30 minutes. The final thickness of the layered superlattice films 30 ranged between 1400 Å and 2100 Å, depending on the sample.

Figure 17:
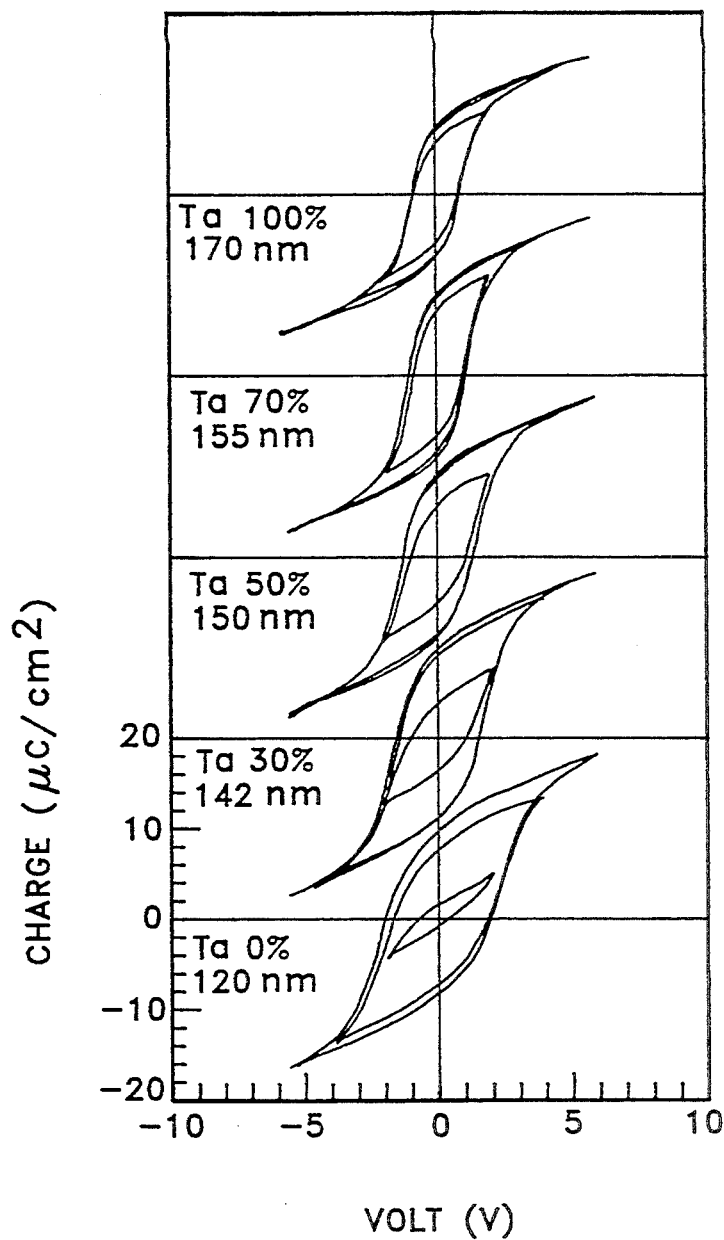
FIG. 17 shows hysteresis curves at 2, 4, and 6 volts for samples comprising different solid solutions of strontium bismuth tantalate and strontium bismuth niobate.
Figure 18:
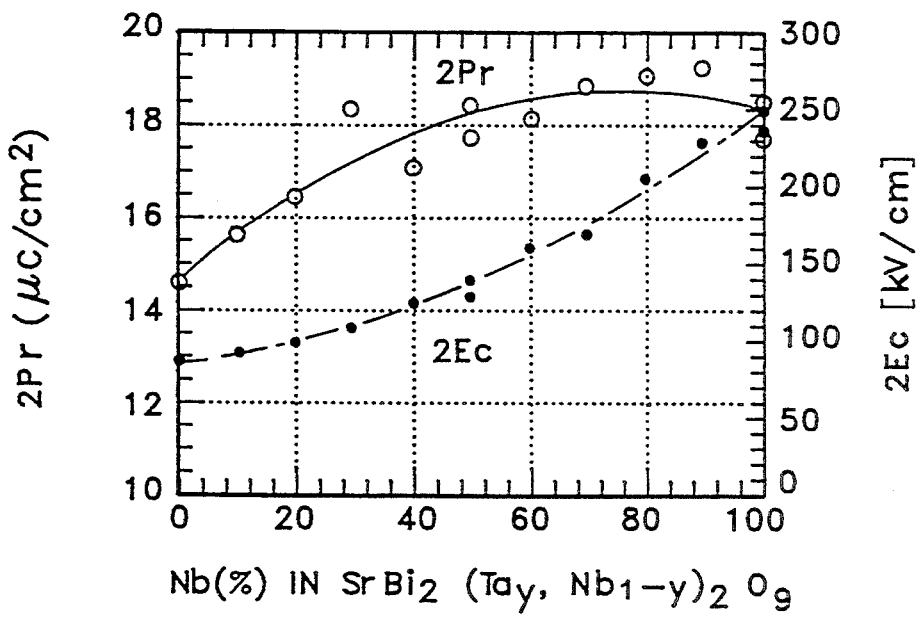
FIG. 18 shows graphs of 2Pr and 2Ec for samples comprising different solid solutions of strontium bismuth tantalate and strontium bismuth niobate.
Figure 19:
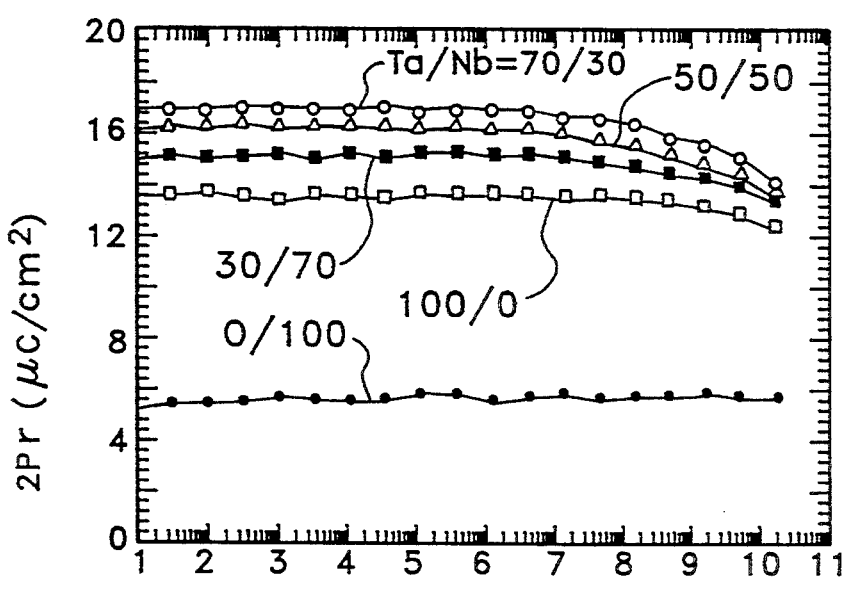
FIG. 19 shows graphs of 2Pr versus number of cycles for samples comprising different solid solutions of strontium bismuth tantalate and strontium bismuth niobate.

FIG. 17 is a graph of the hysteresis curves for five samples of strontium bismuth tantalum niobate (TaNb) having the following percentages of Ta: 100% ($SrBi_2Ta_2O_9$); 70%; 50%; 30%; and 0% ($SrBi_2Nb_2O_9$). The voltages at which the hysteresis curves were taken were 2, 4, and 6 volts as before. FIG. 18 shows a plot of 2 Pr and 2 Ec versus the percentage of Nb, as compared to Ta, in the $SrBi_2(Ta_y, Nb_{1-y})_2O_9$, with 2 Pr and 2 Ec being measured as before from ±6 volt hysteresis curves. The substitution of niobium for the tantalum caused both 2 Pr and 2 Ec to increase dramatically. FIG. 19 shows the fatigue curves out to $2 \times 10^{10}$ cycles for five different samples of TaNb with five different ratios of Ta to Nb. The samples were fatigued at 300 kV/cm and the hysteresis curves from which the data for the fatigue curves were taken were performed at 250 Kv/cm. It is further noted that if the same molarity is used for precursor solutions, the viscosity of the solutions changes with the Ta/Nb ratio, with the Ta precursor being more viscous than the Nb precursor. As a result the final thickness of the 100% Ta films is approximately twice as thick as the 100% Nb films. Further, Ta enriched films tend to saturate their hysteresis at a lower voltage than Nb enriched films. Thus the values of 2 Pr in FIG. 19 for the various ratios differ from those in FIG. 18. The resistance to fatigue is excellent for all samples. However, the large coercive field for samples with a high percentage of Nb would result in devices requiring large voltages to operate. Therefore, in view of practical electronic device applications, an amount of tantalum in $SrBi_2(Ta_y,Nb_{1-y})_2O_9$ with y between 0.8 and 1.0 is recommended.

Figure 20:
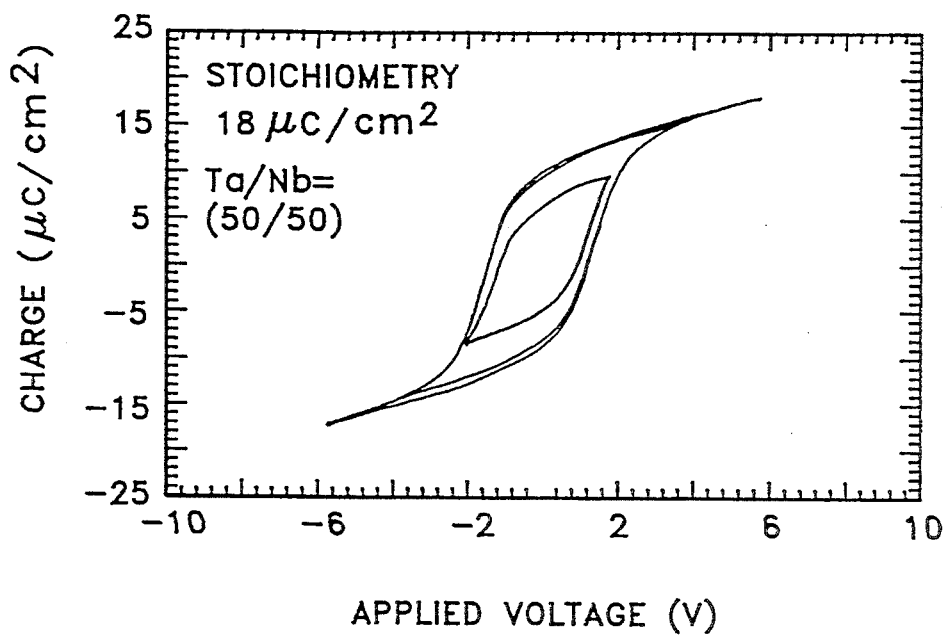
FIG. 20 shows hysteresis curves at 2, 4, and 6 volts for a sample of 50/50 strontium bismuth tantalate and strontium bismuth niobate fabricated with a stoichiometric precursor solution.
Figure 21:
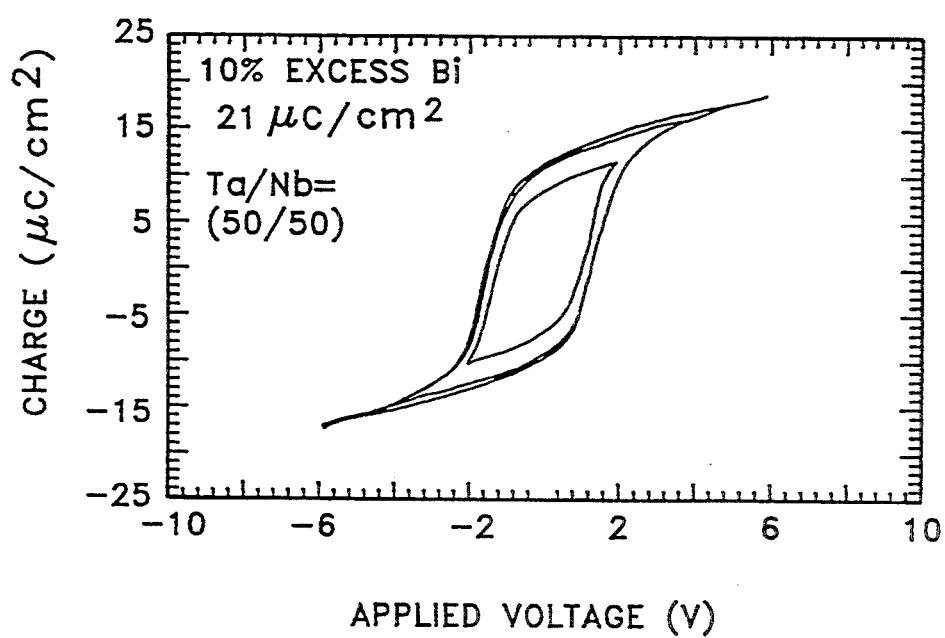
FIG. 21 shows hysteresis curves at 2, 4, and 6 volts for a sample of 50/50 strontium bismuth tantalate and strontium bismuth niobate fabricated with a precursor solution with a bismuth content 10% in excess of stoichiometry.

Two additional samples of $SrBi_2(Ta_y, Nb_{1-y})_2O_9$ with a tantalum/niobium ratio of 1, were fabricated using the same process as Example 4, except that n-butyl acetate was added as a second solvent, and three coats were applied in steps 90 (FIG. 1), with the resulting thickness of the film 30 being 1850 Å. In one sample the concentration of bismuth in the mixed precursor was stoichiometric, and in the other there was 10% excess bismuth. The hysteresis curves for the two samples at 2 volts, 4 volts, and 6 volts are given in FIGS. 20 and 21. Comparing the curves to the 1.00 and 1.10 curves in FIG. 10A and 10B the effect of the bismuth content is similar. It has been found that in general, in all the compositions discussed in this disclosure, the effect of excess bismuth is similar: 2 Pr increases as a function of bismuth content in the precursor solutions out to a peak value and then tends to decrease slowly until the material degrades due to too much bismuth.

In the crystalline structure of strontium bismuth niobate, niobium has the same valence and almost the same ionic radii as tantalum in strontium bismuth tantalate. Thus tantalum and niobium can substitute for one another in the crystal structure without restriction. All of the resulting materials are excellent ferroelectrics. The next example illustrates the result when two layered superlattice materials with significantly different crystal structure are mixed in solid solution.

EXAMPLE 5—Strontium Bismuth Tantalum Titanate (TITa)

A series of wafers 10 including a number of capacitors 12, 24, 16, etc. was fabricated in which the layered superlattice material 30 was strontium bismuth tantalum titanate [$SrBi_{4-2y}(Ta_y, Ti_{2-2y})_2O_{15-6y}$], that is, a solid solution of Ti and Ta, was fabricated. The precursor solution comprised strontium 2-ethylhexanoate, bismuth 2-ethylhexanoate, tantalum 2-ethylhexanoate and titanium 2-ethylhexanoate in a xylenes solvent. The four metal 2-ethylhexanoates were mixed in a proportion such that the strontium, bismuth, tantalum, and titanium were present in the mixed precursor in stoichiometric proportions, with y taking on a series of values from 0 to 1. The molarity of the solution was approximately 0.07 moles per liter. No dilution with a second solvent was performed. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_{4-2y}(Ta_y, Ti_{2-2y})_2O_{15-6y}$ precursor solution on the substrate 18. The wafer was spun at 1500 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of 100–200 cc/minute. The steps from using an eyedropper to deposit solution on the wafer through RTP baking were repeated for three coats. The wafer was then transferred to a diffusion furnace and annealed at 800° C. in an oxygen flow of 6 l/m for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/m for 30 minutes. The final thickness of the layered superlattice films 30 ranged between 2000 Å and 3500 Å, depending on the sample.

Figure 22:
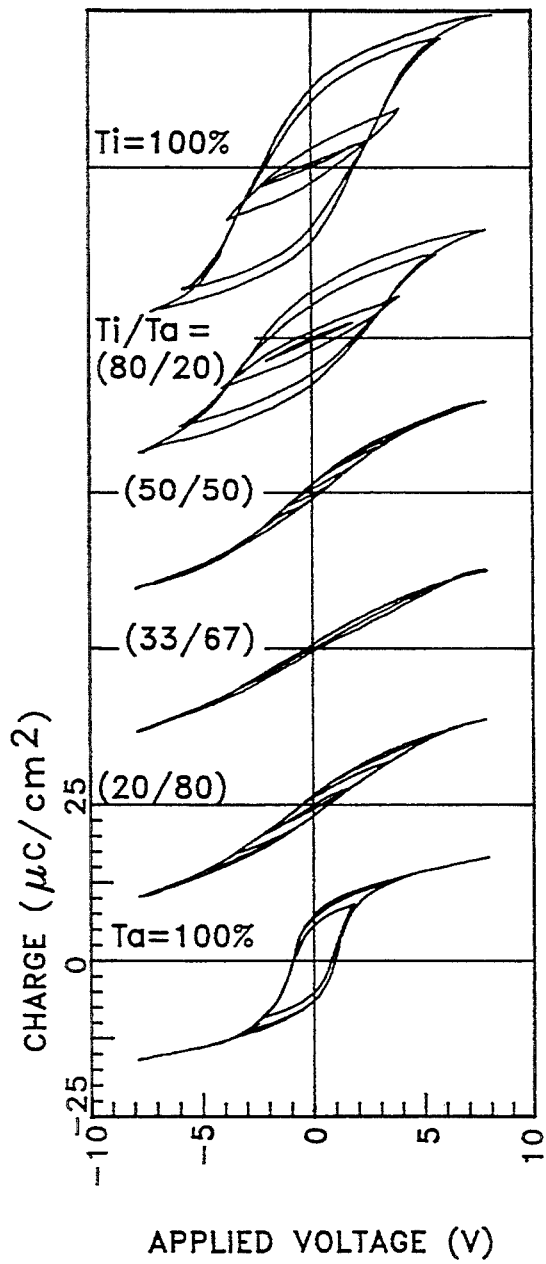
FIG. 22 shows hysteresis curves at 2, 4, 6, and 8 volts for samples comprising different solid solutions of strontium bismuth titanate and strontium bismuth tantalate.

FIG. 22 is a graph of the hysteresis curves for six different samples of strontium bismuth tantalum titanate (TiTa) having the following percentages of Ti: 100% ($SrBi_4Ti_4O_{15}$); 80%; 50%; 33%; 20%; and 0% ($SrBi_2Ta_2O_9$). The voltages at which the hysteresis curves were run was 2, 4, and 6 volts as before. In this instance, while both the strontium bismuth titanate and the strontium bismuth tantalate are excellent ferroelectrics, solid solutions of the two near 50/50 ratios are not. Moreover a broad range of ferroelectric properties, such as values of 2 Pr and 2 Ec are represented near the two extremes of the solid solutions.

EXAMPLE 6—Strontium Bismuth Nioblum Titanate (TiNb)

Another series of wafers 10 including a number of capacitors 12, 24, 16, etc. was fabricated in which the layered superlattice material 30 was strontium bismuth niobium titanate [$SrBi_{4-2z}(Nb_z, Ti_{2-2z})_2O_{15-6y}$], that is a solid solution of Ti and Nb, was fabricated. The precursor solution comprised strontium 2-ethylhexanoate, bismuth 2-ethylhexanoate, niobium 2-ethylhexanoate and titanium 2-ethylhexanoate in a xylenes solvent. The four metal 2-ethylhexanoates were mixed in a proportion such that the strontium, bismuth, niobium and titanium were present in the mixed precursor in stoichiometric proportions, with z taking on a series of values from 0 to 1. The molarity of the solution was approximately in the range 0.07 moles per liter to 0.09 moles per liter depending on the sample. Otherwise the fabrication process was the same as for Example 5 above. The final thickness of the film 30 was between 2200 Å, and 2650 Å depending on the sample.

Figure 23:
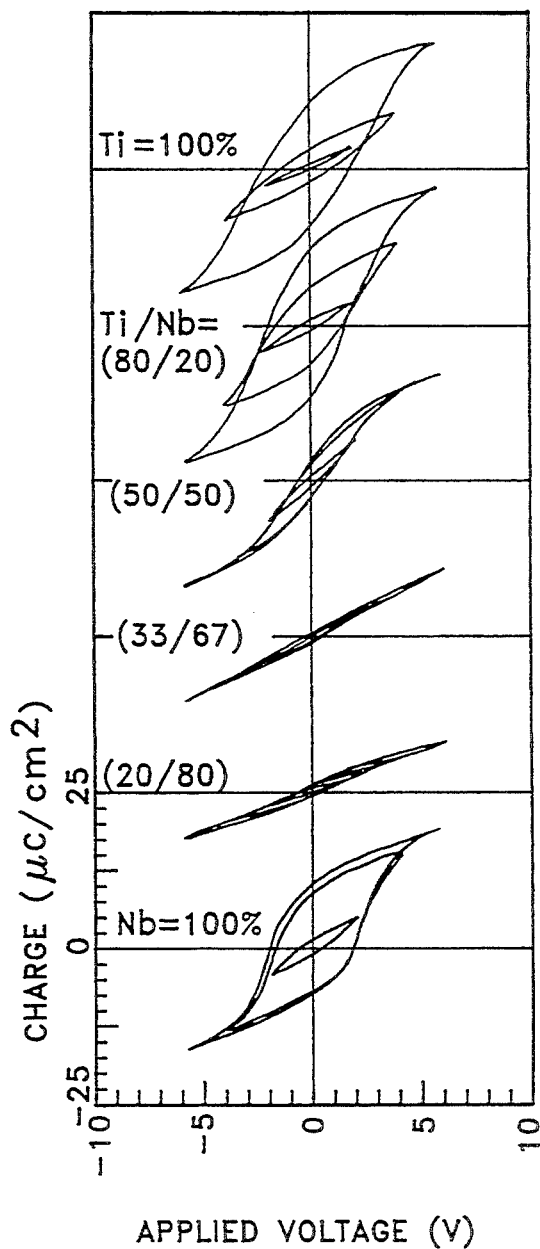
FIG. 23 shows hysteresis curves at 2, 4, and 6 volts for samples comprising different solid solutions of strontium bismuth titanate and strontium bismuth niobate.

FIG. 23 is a graph of the hysteresis curves for six different samples of strontium bismuth niobium titanate (TiNb) having the following percentages of Ti: 100% ($SrBi_4Ti_4O_{15}$); 80%; 0%; 33%; 20%; and 0% ($SrBi_2Nb_2O_9$). The voltages at which the hysteresis curves were run was 2, 4, and 6 volts as before. Again, while both the strontium bismuth titanate and the strontium bismuth niobate are excellent ferroelectrics, solid solutions of the two near 50/50 ratios are not. Also a broad range of ferroelectric properties, such as values of 2 Pr and 2 Ec are represented near the two extremes of the solid solutions.

EXAMPLE 7—Strontium Bismuth Tantalum Nioblum Titanate (TITaNb)

Another series of wafers 10 including a number of capacitors 12, 24, 16, etc. was fabricated in which the layered superlattice material 30 was strontium bismuth niobium tantalum titanate [$SrBi_{4-2x}\{(Ta_y, Nb_{1-y})_x, Ti_{2-2x}\}_2O_{15-6x}$], that is, a solid solution of Ti, Ta, and Nb, was fabricated. The precursor solution comprised strontium 2-ethylhexanoate, bismuth 2-ethylhexanoate, tantalum 2-ethylhexanoate, niobium 2-ethylhexanoate, and titanium 2-ethyihexanoate in a xylenes solvent. The five metal 2-ethylhexanoates were mixed in a proportion such that the strontium, bismuth, niobium and titanium were present in the mixed precursor in stoichiometric proportions, with x and y taking on a series of values from 0 to 1. Otherwise the fabrication process was the same as for Example 6 above. The final thickness of the film 30 was between 1850 Å and 24000 Å depending on the sample.

Figure 24:
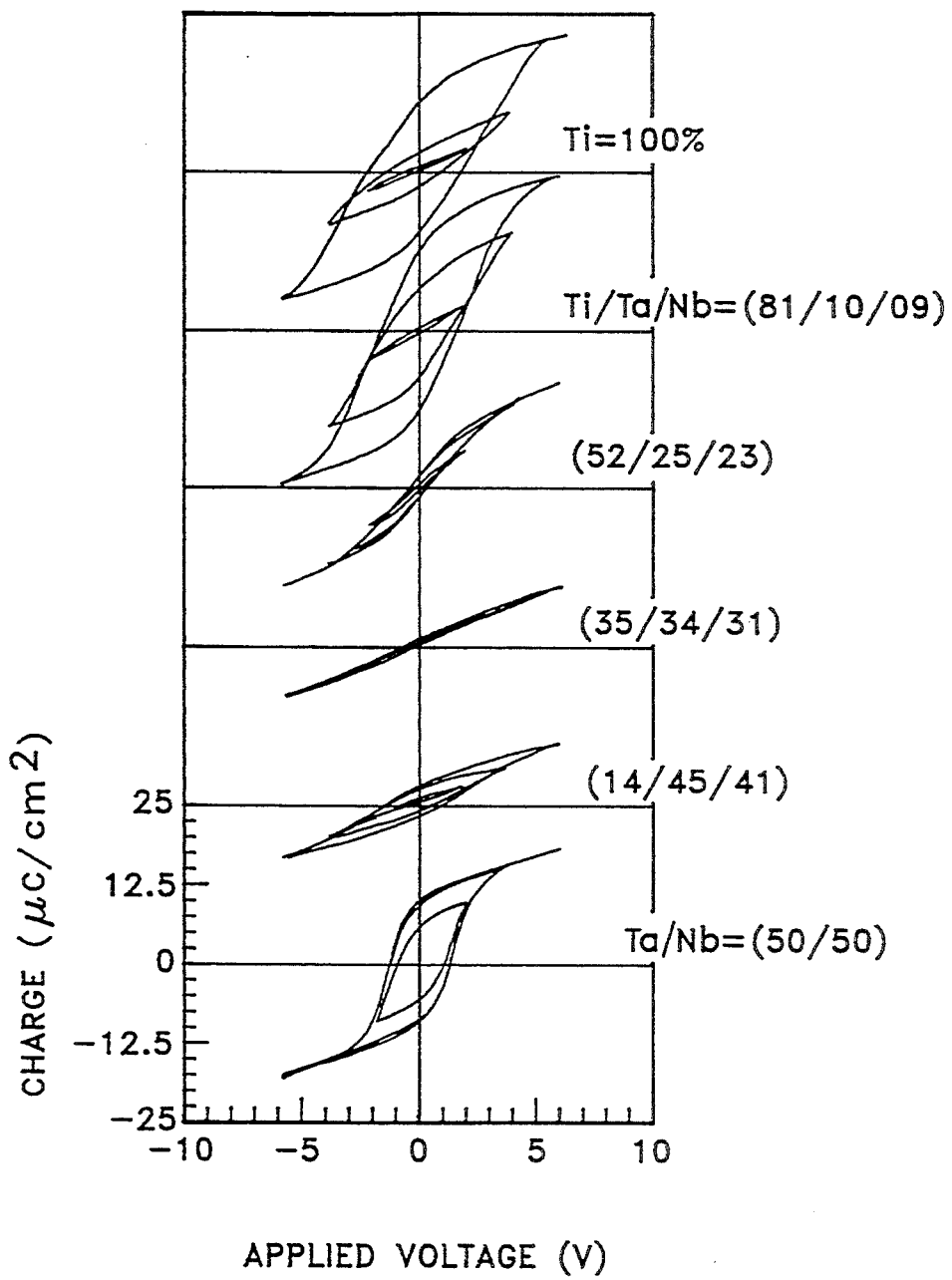
FIG. 24 shows hysteresis curves at 2, 4, and 6 volts for samples with different solid solutions of strontium bismuth titanate, strontium bismuth tantalate, and strontium bismuth niobate.

All three of the materials strontium bismuth tantalate (Ta), strontium bismuth niobate (Nb), and strontium bismuth titanate (Ti) may be mixed in solid solution in arbitrary ratio, making a single mixed ferroelectric phase, which can be represented by the following general formula: $SrBi_{4-2x}\{(Ta_y, Nb_{1-y})_x, Ti_{2-2x}\}_2O_{15-6x}$, where x and y can take on any value between 0 and 1. FIG. 24 is a graph of the hysteresis curves for six different samples of TiTaNb having the following percentages of Ti/Ta/Nb: 100%/0%/0% ($SrBi_4Ti_4O_{15}$); 81%/10%/09%; 52%/25%/23%; 35%/34%/31%;14%/45%/41%; and 0%/50% 50% ($SrBi_2TaNbO_9$). The voltages at which the hysteresis curves were run was 2, 4, and 6 volts as before. Again, while strontium bismuth titanate and strontium bismuth tantalum niobate are excellent ferroelectrics, solid solutions of the two near 50/50 ratios are not. Again, a broad range of ferroelectric properties, such as values of 2 Pr and 2 Ec are represented near the two extremes of the solid solutions.

Figure 25:
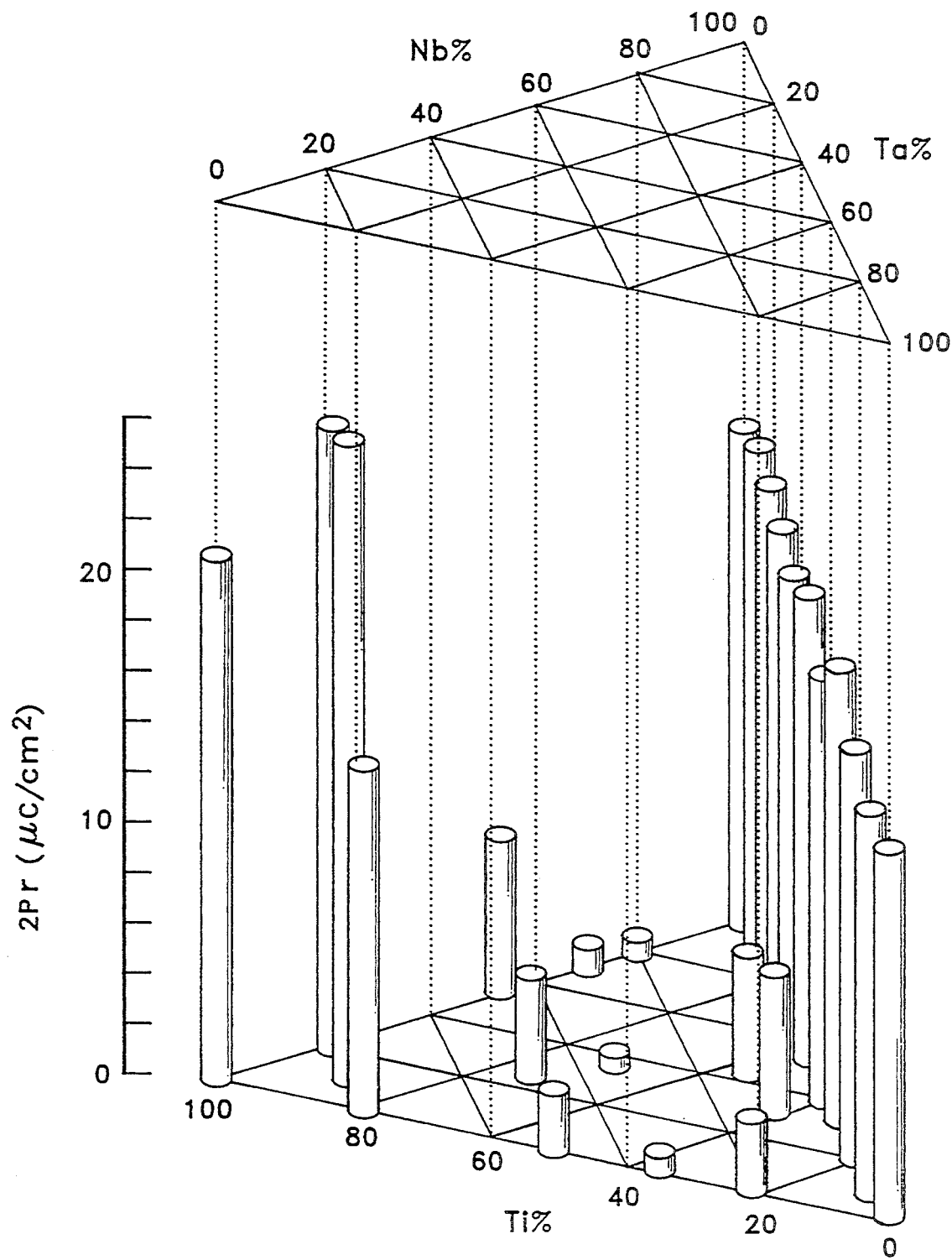
FIG. 25 shows a triangular diagram showing 2Pr for a variety of different solid solutions of strontium bismuth titanate, strontium bismuth tantalate, and strontium bismuth niobate.

FIG. 25 is a three dimensional diagram (represented in two-dimensions) showing 2 Pr of most of the different layered superlattice materials and solid solutions fabricated and discussed in the above examples. Many patterns emerge from this diagram, including the one discussed in relation to FIG. 18, i.e. the rise of 2 Pr from 100% Ta to 100% Nb, the generally lower value of 2 Pr toward the center of the diagram, and others that were not evident from the isolated data, such as the rise in 2 Pr along the 50% Ti line as it goes from 50% Ta to 50% Nb. Such patterns permit one to use records such as FIG. 25 to design ferroelectric devices having specific, predictable properties.

Figure 26:
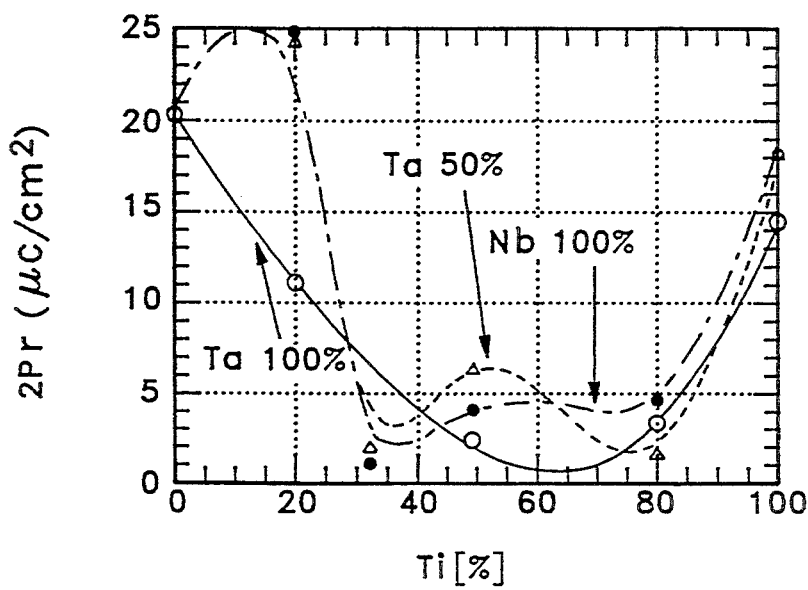
FIG. 26 shows graphs of 2Pr versus percentage of titanium for solid solutions of strontium bismuth titanate, strontium bismuth tantalate, and strontium bismuth niobate for differing relative amounts of tantalum and niobium.

FIG. 26 is a graph showing the relation between 2 Pr and the percentage of Ti in compositions of layered superlattice materials comprising solid solutions of Ti, Ta, and Nb having specific percentages of Ta and Nb. Such curves depict slices through the three dimensional diagram of FIG. 25 parallel to the Ti axis. Such "slices" make it easier to recognize patterns that provide design direction and advantages.

FIG. 27 is a table in which some of the data discussed above, including the sample thickness, is arranged in groups from which patterns emerge. This table illustrates another way of arranging data in records to assist in the design of electronic devices.

Figure 28:
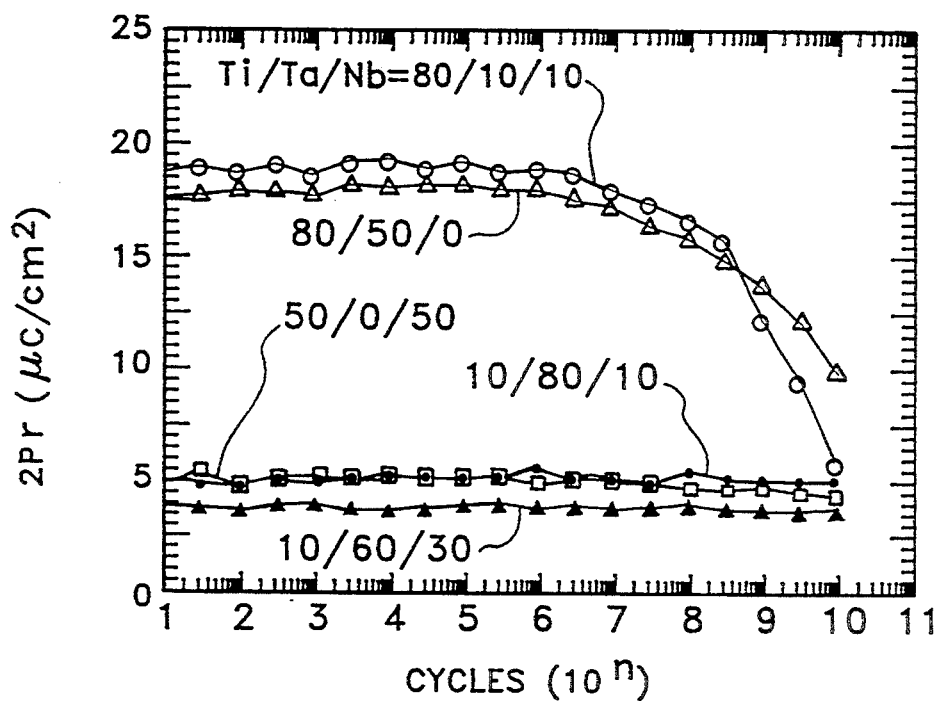
FIG. 28 shows graphs of 2Pr versus number of cycles for some of the samples of FIGS. 22 through 24.

FIG. 28 is a graph showing fatigue curves for various TiTaNb layered superlattice compositions discussed above. The data shows that compositions with high Ti content ($0.0 \leq x \leq 0.2$), shows a large 2 Pr but poor resistance to fatigue beyond $10^9$ cycles. On the other hand, compositions with about equal Ti and Nb content, show a comparably excellent resistant to fatigue to the TaNb compounds. This curve thus illustrates still another method of recording data that can cause patterns useful in design of electronic devices to surface.

There exist numerous other layered superlattice materials, and numerous other elements besides tantalum, niobium, and titanium can also be included in the layered superlattice solid solutions discussed above, as well as numerous other solid solutions. These possibilities are too numerous to discuss fully here. However, to illustrate this, a solid solution including zirconium will be discussed in the next example.

EXAMPLE 8—Strontium Bismuth Titanium Zirconate (ZrTi)

Another series of wafers 10 including a number of capacitors 12, 24, 16, etc. was fabricated in which the layered superlattice material 30 was strontium bismuth titanium zirconate [$SrBi_4(Ti_zZr_{1-z})_4O_{15}$], that is, a solid solution of Zr and Ti, was fabricated. The precursor solution comprised strontium 2-ethylhexanoate, bismuth 2-ethylhexanoate, titanium 2-ethylhexanoate and zirconium 2-ethylhexanoate in a xylenes solvent. The four metal 2-ethylhexanoates were mixed in a proportion such that the strontium, bismuth, niobium and titanium were present in the mixed precursor in stoichiometric proportions, with z taking on a series of values from 0 to 1. The molarity of the solution was diluted to approximately 0.07 moles per liter by the addition of n-butyl acetate as a second solvent. The RTP bake step 89 (FIG. 1) was performed with a holding temperature of 750° C. Otherwise the fabrication process was the same as for Example 7 above. The final thickness of the film 30 was between 3000 Å and 3500 Å depending on the sample.

Figure 30:
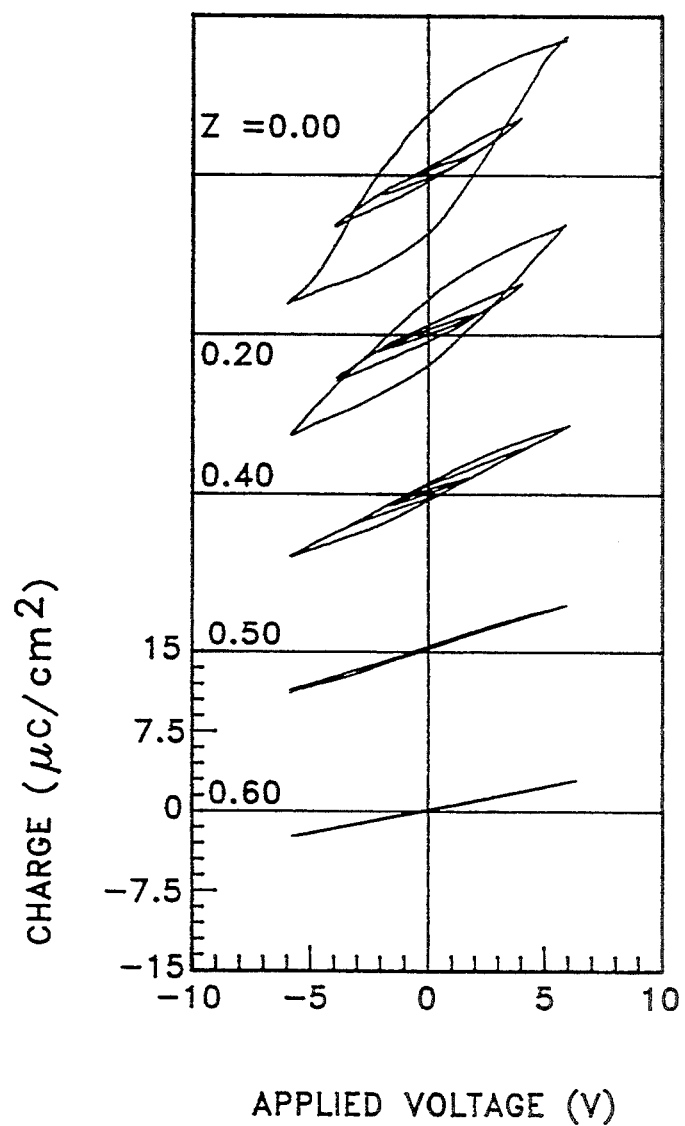
FIG. 30 shows hysteresis curves at 2, 4, and 6 volts for samples with different solid solutions of strontium bismuth titanate and strontium bismuth zirconate.
Figure 31:
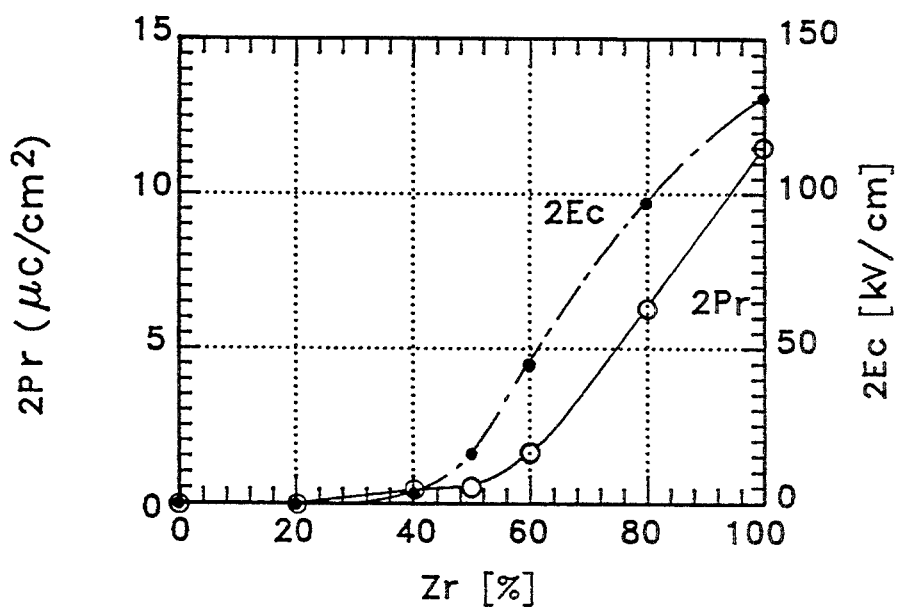
FIG. 31 shows graphs of 2Pr and 2Ec versus zirconium percentage for the samples of FIG. 30.
Figure 32:
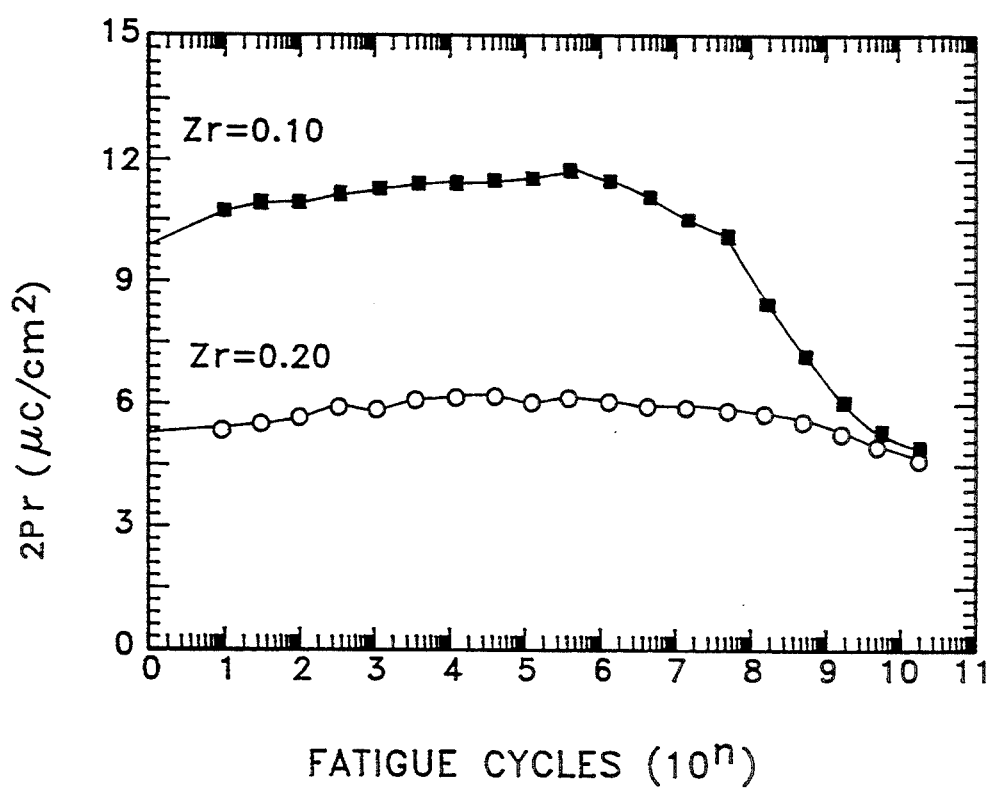
FIG. 32 shows graphs of 2Pr versus number of cycles for two different samples of solid solutions of strontium bismuth titanate and strontium bismuth zirconate having different percentages of zirconium.

Zirconium is in the same transition metal column of the periodic table of the elements as titanium and can be easily substituted for titanium in a layered superlattice crystal structure in an arbitrary amount. FIG. 30 is a graph of the hysteresis curves for six different samples of ZrTi having the following percentages of Zr: 0% ($SrBi_4Ti_4O_{15}$); 20%; 40%; 50%; and 60%. The voltages at which the hysteresis curves were run was 2, 4, and 6 volts as before. In this case, the ferroelectric properties disappear if more than 50% zirconium is added. This does not mean that the material with more than 50% Zr is not a layered superlattice material; it may merely mean that the ferroelectric transition temperature changes so that the material is no longer ferroelectric at room temperature, and/or that the material becomes a layered superlattice dielectric material. FIG. 31 is a graph of 2 Pr and 2 Ec as a function of Zr percentage, while FIG. 32 shows the fatigue curves for the material with 10% Zr and the material with 20% Zr. The figures show that while 2 Pr and 2 Ec decrease close to linearly with the addition of Zr, the resistance to fatigue improves with the addition of Zr, at least up to 20%. Thus Zr also offers opportunities for device design.

The ZrTi compound can be combined with any of the layered superlattice materials and solid solutions thereof that were discussed above in arbitrary ratios. The electronic properties of such solid solutions form a continuum with the electronic properties discussed above. Thus each metal that forms layered superlattice materials literally adds a new dimension to a diagram such as shown in FIG. 25. Other metals that form layered superlattice materials and thus add such new dimensions include, of course, strontium and bismuth which have been in all the compounds discussed herein, and also calcium, barium, cadmium, lead, hafnium, tungsten, scandium, yttrium, lanthanum, antimony, chromium, and thallium.

5. Process Utilizing Gradient of Elements that Vaporize Easily

Figure 33:
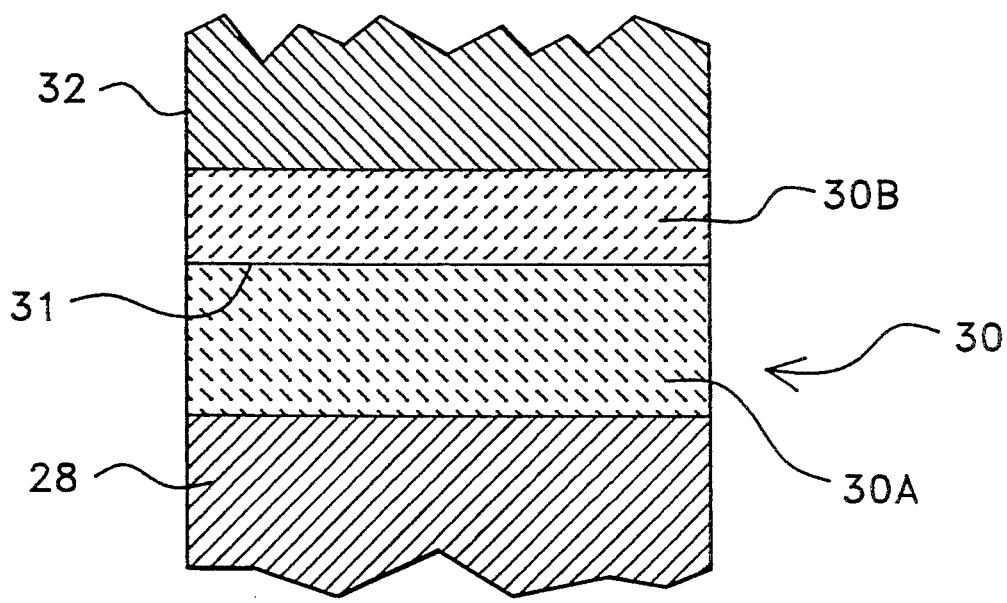
FIG. 33 shows a portion of a wafer as in FIG. 3 in which the layered superlattice material has a gradient in the proportion of an element that vaporizes easily.

As discussed above, certain elements, such as bismuth, lead, thallium and antimony tend to form high vapor pressure compounds that vaporize easily during the annealing and other heating processes that occur during the layered superlattice material fabrication process. A novel fabrication process has been devised for layered superlattice materials that include such elements that vaporize easily. Referring to FIGS. 3 and 33, according to the process, a wafer 10 is fabricated as in the processes discussed above, except that the layer 30 is fabricated in at least two thin film portions, first thin film 30A and second thin film 30B, for which different precursors are used. The precursor of the second thin film 30B distal from the substrate 18 preferably has a greater concentration of the easily vaporized element than the thin film 30A proximal to the substrate 18. Thus, this process is characterized by the creation of a gradient in the proportion of the easily vaporized element in the uncured film in the direction of film thickness; preferably, the amount of the element is greater in the portion 30B of film 30 which is exposed in the anneal of the layered superlattice material 30. The process is illustrated by the following example.

EXAMPLE 9—Bismuth Gradient

A wafer 10 including a number of capacitors 12, 24, 16, etc. was fabricated in which the layered superlattice material 30 was strontium bismuth tantalate. Two precursor solutions were prepared, both solution comprising tantalum 2-ethylhexanoate, strontium 2-ethylhexanoate and bismuth n-octanoate in a xylenes solvent. The first solution was a stoichiometric solution including strontium, bismuth and tantalum in molecular ratios of 1.0:2.0:2.0 respectively; in the second solution strontium, bismuth and tantalum were in molecular ratios of 1.0:2.4:2.0 respectively, which is a 20% bismuth enriched solution. The stoichiometric solution was diluted to a concentration of approximately 0.06 moles per liter by addition of xylenes. A substrate 18 comprising a single crystal silicon layer 22 oriented in the [100]direction, a 5000 Å thick layer 24 of silicon dioxide prepared by thermal oxidation, a 200 Å thick layer 26 of titanium, and a 2000 Å thick layer 28 of platinum was prebaked at 800° C. in a diffusion furnace for 30 minutes with an oxygen flow of 6 liters/min. A ml of the first precursor solution was placed on the substrate 18. The wafer was spun at 2000 RPM for 40 seconds. The wafer 10 was then placed on a hot plate and baked in air at about 170° C. for 5 minutes and then at 250° C. for another 5 minutes. The wafer 10 was then RTP baked at 725° C. with a ramping rate of 125° C./sec, a hold time of 30 seconds, and an ambient oxygen flow of 100–200 cc/minute. The steps from depositing solution on the wafer through RTP baking were repeated again for a total of two coats, thereby forming first thin film 30A. Then the second precursor solution with excess bismuth content was applied onto the stoichiometric film on the wafer. All process parameters were the same for the formation of the second thin film as for the first thin film, except, of course, for the solution composition. This resulted in the formation of second thin film 30B. The wafer was then transferred to a diffusion furnace and annealed at 800° C. in an oxygen flow of 6 l/m for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/m for 30 minutes. The final thickness of the layered superlattice films 30 was about 2000 Å.

Another three samples of strontium bismuth tantalate thin film, which we shall call reference samples, were prepared for comparison purposes. In the first reference sample, the process was exactly the same as for Example 9 except that only the first stoichiometric precursor was used in fabricating both the first thin film 30A and the second thin film 30B. That is, the precursor was stoichiometric for all four coats. In the second reference sample, the process again was the same except this time a precursor with 7% excess bismuth was used for both the first thin film 30A and the second thin film 30B, that is, for all four coats. In the third reference sample, the film was prepared as for the second reference example, with a 7 excess bismuth precursor solution, except that no RTP bake step was used. That is, none of the coats were RTP baked. In all three reference examples the final thin film 30 was about 2000 Å.

The microstructures of the thin films fabricated in Example 9 and the three reference samples were observed utilizing an SEM (Scanning Electron Microscope). The surface roughness of each was measured over a 500 m length. Hysteresis curves for a 100 m × 100 m capacitor of each sample were measure with a 5 Khz applied voltage of ±6 volts. A portion of each film was dissolved in diluted fluoric acid and the bismuth content was obtained by ICP analysis. Table 1 shows the results.

TABLE I

|  | Average Grain Size (Å) | Surface Roughness (Å) | Bismuth Content (%) | 2Pr (C/cm$^2$) |
|---|---|---|---|---|
| Example 9 (Bi Gradient) | 1200 | ±150 | 99 | 21.1 |
| Ref. #1 (Stoich.) | 1150 | ±120 | 85 | 17.6 |
| Ref. #2 (7% Ex. Bi) | 1200 | ±150 | 103 | 19.8 |
| Ref. #3 (7% Ex. Bi) No RTP | 2500 | ±350 | 101 | 9.7 |

The results show that the sample made using the process having a bismuth gradient had an average grain size of smaller than the sample thickness, and a surface roughness less than 10% of the sample thickness. The bismuth content in the final film was just about stoichiometric, and the value of 2 Pr was excellent. In comparison, the reference sample #1, which was fabricated with a stoichiometric precursor had a slightly smaller grain size and surface roughness, but the bismuth content was 15% below stoichiometry and the value of 2 Pr declined by about 18%. In the case of reference sample #2, which had 7% excess bismuth in the precursor and no gradient, the grain size and the surface roughness was the same as for example 9. The bismuth content was slightly in excess of stoichiometry and the value of 2 Pr declined only 6%. For reference sample #3, made exactly as reference sample #2 except without RTP, the grain size was larger than the sample thickness, the surface roughness was more than twice that of the sample of example 9, and while the bismuth content was close to stoichiometry, the value of 2 Pr declined by 54%.

Figure 35:
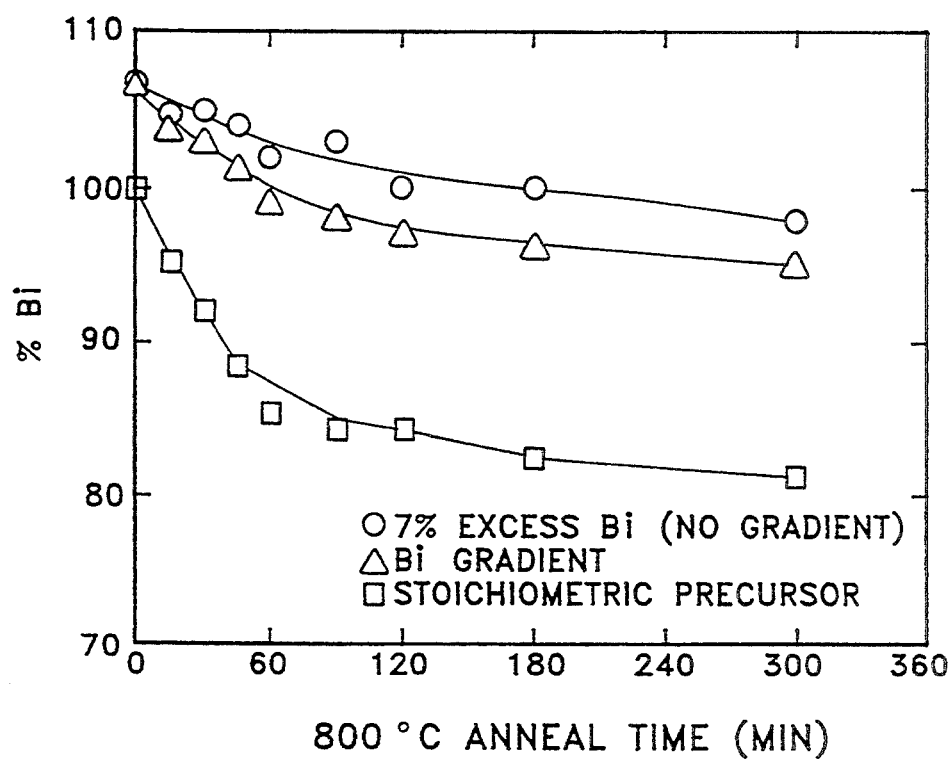
FIG. 35 shows graphs of bismuth content versus anneal time for strontium bismuth tantalate samples having 7% excess bismuth in the precursor, samples having a bismuth gradient, and samples having a stoichiometric precursor.
Figure 36:
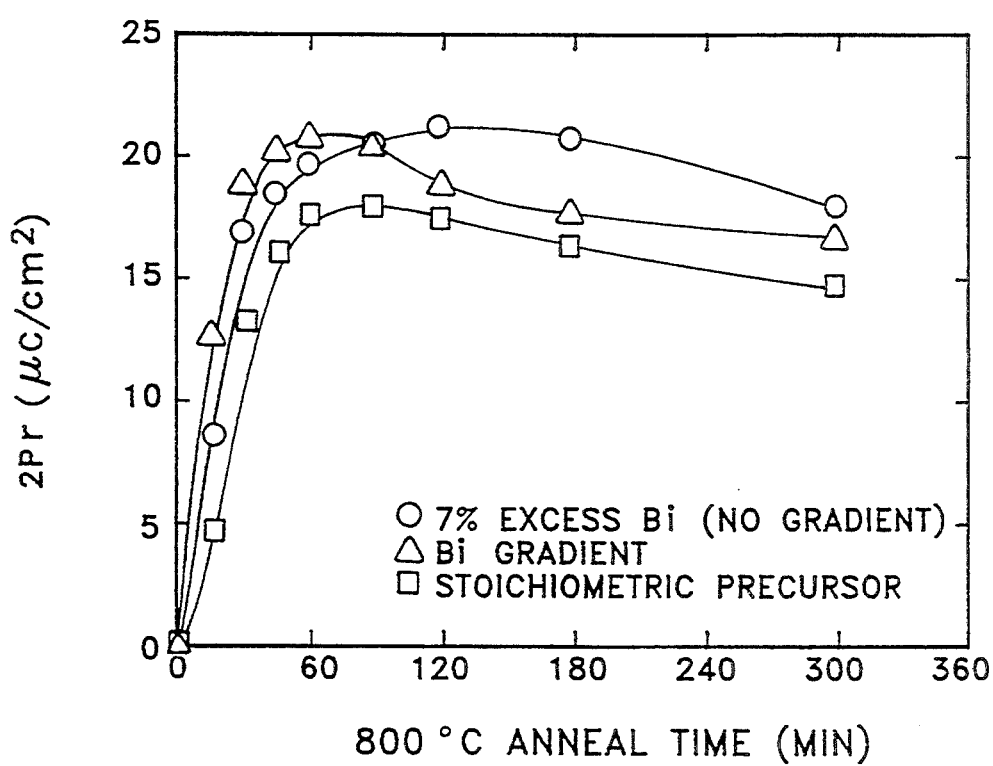
FIG. 36 shows a of 2PR versus anneal time for strontium bismuth tantalate samples having 7% excess bismuth in the precursor, samples having a bismuth gradient, and samples having a stoichiometric precursor.

FIG. 35 shows graphs of bismuth content versus anneal time for the sample of example 9 and the reference #1 and #2 samples. The bismuth content was determined by ICP analysis. FIG. 36 shows graphs of 2 Pr versus anneal time for the same three samples. The value of 2 Pr was determined from hysteresis measurements made with a ±6 volt, 5 kHz sinusoidal wave. FIG. 35 shows that the bismuth content for the film made with the 20% Bi gradient stays slightly lower than the bismuth content for the process using all four coats with 7% excess bismuth. The result for the Bi gradient film is preferable, since the sample reaches 100% Bismuth content sooner. This is more easily seen in FIG. 36. The Bi gradient sample reaches its peak polarizability with about 40 minutes less annealing time than the sample with the uniform 7% excess bismuth. This results in a significant savings in manufacturing time for the device. The sample with a stoichiometric precursor rapidly drops will below both the other samples in bismuth content and also lags in reaching its peak polarizability.

The thicker the second thin film 30B the longer the diffusion time for the excess metal//metal oxide and the longer the annealing time required to reach peak polarizability. Therefore the thickness of the second layer 30B should preferably be 50 percent or less of the total thickness of thin film 30.

It has been found that a grain size of from 200 to 2000 Å provides good quality thin layered superlattice thin films. To achieve such a grain size, an RTP step is usually necessary, particularly when the process having a gradient of the easily vaporizable elements is used. When the layered superlattice material is strontium bismuth tantalate, the second thin film 30B should contain between 2 mol % and 70 mol % excess bismuth above stoichiometry, and preferably from 5 mol % to 50 mol %.

As indicated above, lead, thallium and antimony are also elements that form compounds that vaporize easily. Lead bismuth titanate and lead bismuth tantalate are layered superlattice materials that have been shown to have excellent electronic properties by the present inventors. The preferable amount of excess lead in the second thin film 30B is from 3 mol % to 20 mol % above stoichiometry. The tolerance for excess bismuth is greater in the layered superlattice materials than the tolerance for lead because the lead/lead oxide is included only in the ferroelectric layers of the layered superlattice materials, while in the bismuth/bismuth oxide is included in both the ferroelectric layers and the non-ferroelectric layers; that is, the bismuth is distributed throughout the material while the lead is distributed only in alternate layers.

The above discussion not only illustrates the advantages of the process utilizing a gradient in the vaporizable element, but also further illustrates that advantages of utilizing RTP in the drying or curing step. As indicated in Table I, RTP makes a huge difference in maintaining small grain size and a narrow distribution of grain sizes, improving the crystallinity, preventing cracks and other defects, reducing the incidence of shorts, and the obtaining of excellent electrical parameters such as high 2 Pr. As discussed in section 2 above, this is due to the fact that RTP promotes nucleation. In the prior art processes, the number of nucleation sites is relatively low. Thus the growth of grains in the annealing step tends to take place at a fewer number of sites, with the result that there are many large grains, and a large grain size distribution. This results in erratic growth, cracks, and defects, propensity to short circuit, and lower electrical values. The control of grain size also leads to better overall control of the thin film composition, which enhances the ability to design materials.

6. Use of the Data in Designing and Making Electronic Devices

Figure 29:
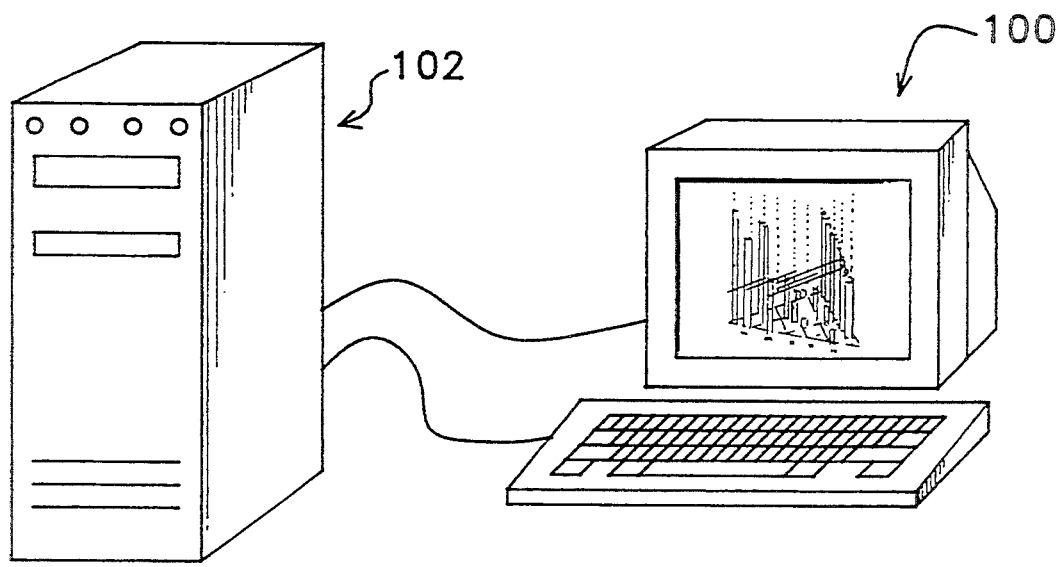
FIG. 29 shows a computerized system for designing electronic devices utilizing layered superlattice materials.

In the above discussion, particularly in the discussion of the three dimensional diagram of TiTaNb in FIG. 5, and the discussion of looking at slices through the diagram to discover patterns, it becomes clear the a powerful tool for designing electronic devices utilizing layered superlattice materials has been disclosed. This tool lends itself to being utilized on a computer 100, such as shown in FIG. 29. That is, by recording the data discussed herein in a data base in a computer memory 102 in terms of "base" layered superlattice materials designated by a dimension in a space, such as Ti, Ta, and Nb in three dimensions, or Ti, Ta, Nb, and Zr in four dimensions, and utilizing computer assisted design (CAD) technology that is available, one can use the computer 100 to select materials that satisfy particular design specifications. In the data base, the electronic properties of the layered superlattice materials are a substantially continuous function of the components of the solid solutions, and/or the relative amount of the elements comprising the layered superlattice compounds. By "substantially continuous" is meant that the data is such that, either by interpolation of otherwise, the system can provide an accurate value of the electronic property as a function of material, or vice versa, within the typical resolution of computer displays or printouts. One can also use fabrication process parameters, such as RTP bake temperature and time, furnace anneal temperature, furnace anneal time, and furnace anneal atmosphere, to create another multidimensional record linking the process parameters to electronic parameters such as polarizability, coercive field, leakage current, dielectric constant, and fatigue, which record can similarly be utilized in a CAD system to design electronic devices. Likewise parameters such as bismuth content, which are in one aspect material parameters and in another aspect process parameters, also can form additional dimensions in such a design system. The material, the process, and the in-between dimensions can be combined in an integrated design system.

Another factor that can be integrated into the design system is the compatibility or incompatibility of particular elements, such as metals, with the conventional integrated circuit materials. Conventional integrated circuit technology has been limited to a surprisingly small set of materials, such as silicon-based material, gallium arsenide-based materials, nitrides, and metals such as tungsten, aluminum, and platinum that are compatible with these. This is because the materials in an integrated circuit must spend a long time in very close relationships, and over time many materials diffuse or otherwise change when placed adjacent to the certain other materials. However, there are a very large number of layered superlattice materials, and as was seen above, many if not most can be intermingled in solid solutions. Thus the prospects of finding compatible materials becomes much better than in conventional integrated circuit technology.

The technology described herein lends itself to electronic design for several reasons. First, the electronic properties of layered superlattice materials generally are continuous as the process, material, or other parameters are incrementally changed. This permits the use of efficient, computerized mathematical algorithms to search among the large number of possibilities. Second, there are an incredibly large number of possible layered superlattice materials, thus the compatibility problems of conventional technology lend themselves to being sorted out via computer. Finally an ordered crystal structure such as a layered superlattice material lends itself to analysis much better than the varied, seat-of-the-pants type of knowledge that characterizes conventional integrated circuit technology.

As shown in FIGS. 25, 26, and 27, a feature of the invention is that layered superlattice materials with high 2 Pr, i.e. between 15 coulombs/$cm^2$ and substantially 25 C/$cm^2$, have been made. The processes of Examples 4–7, particularly with excess bismuth in the precursor, are useful for obtaining high polarizabilities.

There has been described optimized processes and compositions for making electronic devices utilizing layered superlattice materials, the dependence of the electronic properties on the processes and compositions has been demonstrated, and methods for utilizing the data on electronic properties as a function of layered superlattice processes and compositions to make electronic devices has been described. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that prebaking of the substrate, RTP bake, and bismuth content have been identified as critical for layered superlattice material optimization, these processes can be combined with conventional processes to provide variations on the processes described. It is also evident that the steps recited may in some instances be performed in a different order. Or equivalent structures and process may be substituted for the various structures and processes described. Or a variety of different dimensions and materials may be used. Further, now that the impact of the regularity of the properties of layered superlattice materials and the variety of the materials on electronic design and manufacturing has been pointed out, many design and manufacturing processes utilizing the concepts disclosed may be devised. Consequently, the invention is to be construed as embracing each and every novel feature and novel combination of features present in and/or possessed by the fabrication processes, electronic devices, and electronic device manufacturing methods described.

We claim:

1. A method of fabricating a capacitor, said method comprising the steps of:

providing a substrate having a first electrode, and a precursor containing a plurality of metals in effective amounts for forming a layered superlattice material upon thermal treatment of said precursor;

applying said precursor to said substrate;

rapid thermal processing said precursor on said substrate in an oxygen-containing environment to form a layered superlattice material containing said metals on said substrate;

furnace annealing said substrate subsequent to said step of rapid processing; and forming a second electrode on said layered superlattice material after said step of furnace annealing to form a capacitor, and subsequently performing a second furnace anneal 2. A method as in claim 10 and further comprising the steps of patterning said capacitor and subsequently performing a third furnace anneal.

3. A method of fabricating a capacitor comprising the steps of:

providing a first electrode and a precursor containing a metal;

applying said precursor to said first electrode;

annealing said precursor in a first anneal process to form a layered superlattice material;

forming a second electrode on said layered superlattice material to form a capacitor comprising said layered superlattice material between said first and second electrodes; and annealing said superlattice material and second electrode in a second anneal process.

4. A method as in claim 3 and further comprising the steps of patterning said capacitor and annealing said capacitor in a third anneal process.

5. A method as in claim 4 wherein said first anneal process is performed at a first temperature, and each of said second and third anneal processes are performed at a temperature lower than said first temperature.

* * * * *